(12) United States Patent
Kim et al.

(10) Patent No.: US 11,474,899 B2
(45) Date of Patent: Oct. 18, 2022

(54) OPERATION METHOD OF OPEN-CHANNEL STORAGE DEVICE

(71) Applicant: Samsung Electronics Co., Ltd., Suwon-si (KR)

(72) Inventors: Min-Chul Kim, Hwasung-si (KR); Jongwon Lee, Suwon-si (KR); Kyungwook Ye, Hwasung-si (KR); Minseok Ko, Hwasung-si (KR); Yangwoo Roh, Hwasung-si (KR); Sung-Hyun Cho, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 377 days.

(21) Appl. No.: 16/690,676

(22) Filed: Nov. 21, 2019

(65) Prior Publication Data

US 2020/0301780 A1    Sep. 24, 2020

(30) Foreign Application Priority Data

Mar. 20, 2019    (KR) .......................... 10-2019-0031649

(51) Int. Cl.
  *G06F 11/00*     (2006.01)
  *G06F 11/10*     (2006.01)
  *G11C 29/52*     (2006.01)

(52) U.S. Cl.
  CPC .......... *G06F 11/1072* (2013.01); *G11C 29/52* (2013.01)

(58) Field of Classification Search
  CPC ............. G06F 11/1072; G06F 11/0727; G06F 11/1008; G06F 11/1032; G06F 11/1402; G06F 11/1441; G06F 11/0778; G06F 11/1666; G11C 29/52
  See application file for complete search history.

(56) References Cited

U.S. PATENT DOCUMENTS

| | | | |
|---|---|---|---|
| 7,984,325 B2 | 7/2011 | Fukutomi et al. |
| 8,990,495 B2 | 3/2015 | Hallak et al. |
| 9,141,308 B2 | 9/2015 | Lassa et al. |
| 9,202,577 B2 | 12/2015 | Mangold et al. |
| 9,652,376 B2 | 5/2017 | Kuzmin et al. |
| 9,720,616 B2 | 8/2017 | Yu et al. |
| 10,073,640 B1 | 9/2018 | Klein |
| 2011/0041005 A1 | 2/2011 | Selinger |

(Continued)

*Primary Examiner* — Joseph D Manoskey
(74) *Attorney, Agent, or Firm* — Harness, Dickey & Pierce, P.L.C.

(57) ABSTRACT

An open-channel storage device being configured to be controlled by a host including a bad block manager, the open-channel storage device including a buffer memory and a nonvolatile memory device. An operation method of the open-channel storage device includes performing a normal operation under control of the host, detecting a sudden power-off immediately after a program failure associated with a first data block among a plurality of memory blocks included in the nonvolatile memory device while the normal operation is performed, dumping a plurality of user data stored in the buffer memory to a dump block among the plurality of memory blocks in response to the detected sudden power-off, detecting a power-on, and performing a data recovery operation on the plurality of user data stored in the dump block in response to the detected power-on.

20 Claims, 26 Drawing Sheets

(56) References Cited

U.S. PATENT DOCUMENTS

| | | | |
|---|---|---|---|
| 2011/0093650 A1* | 4/2011 | Kwon | G06F 12/0238 |
| | | | 711/E12.001 |
| 2012/0278543 A1 | 11/2012 | Yu et al. | |
| 2013/0138870 A1* | 5/2013 | Yoon | G11C 16/349 |
| | | | 711/E12.008 |
| 2018/0011762 A1 | 1/2018 | Klein | |
| 2018/0307558 A1* | 10/2018 | Chen | G06F 11/14 |
| 2019/0310918 A1* | 10/2019 | Frolikov | G06F 11/1446 |
| 2019/0391867 A1* | 12/2019 | Crowley | G06F 11/0727 |
| 2021/0191864 A1* | 6/2021 | Cho | G06F 12/0804 |

\* cited by examiner

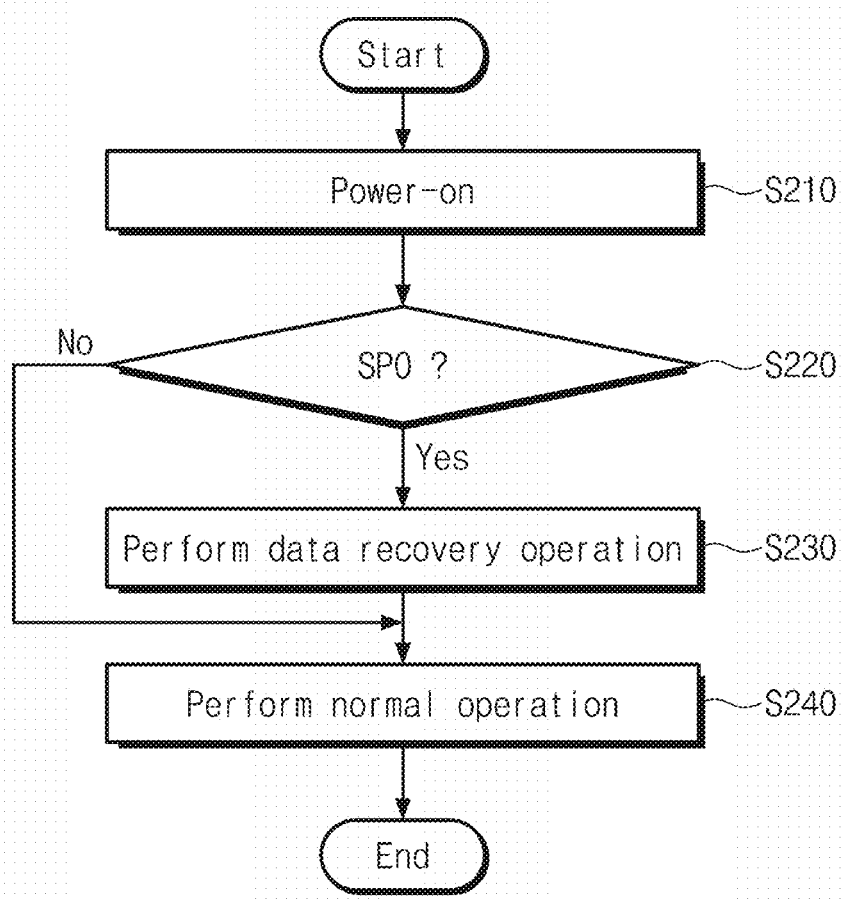

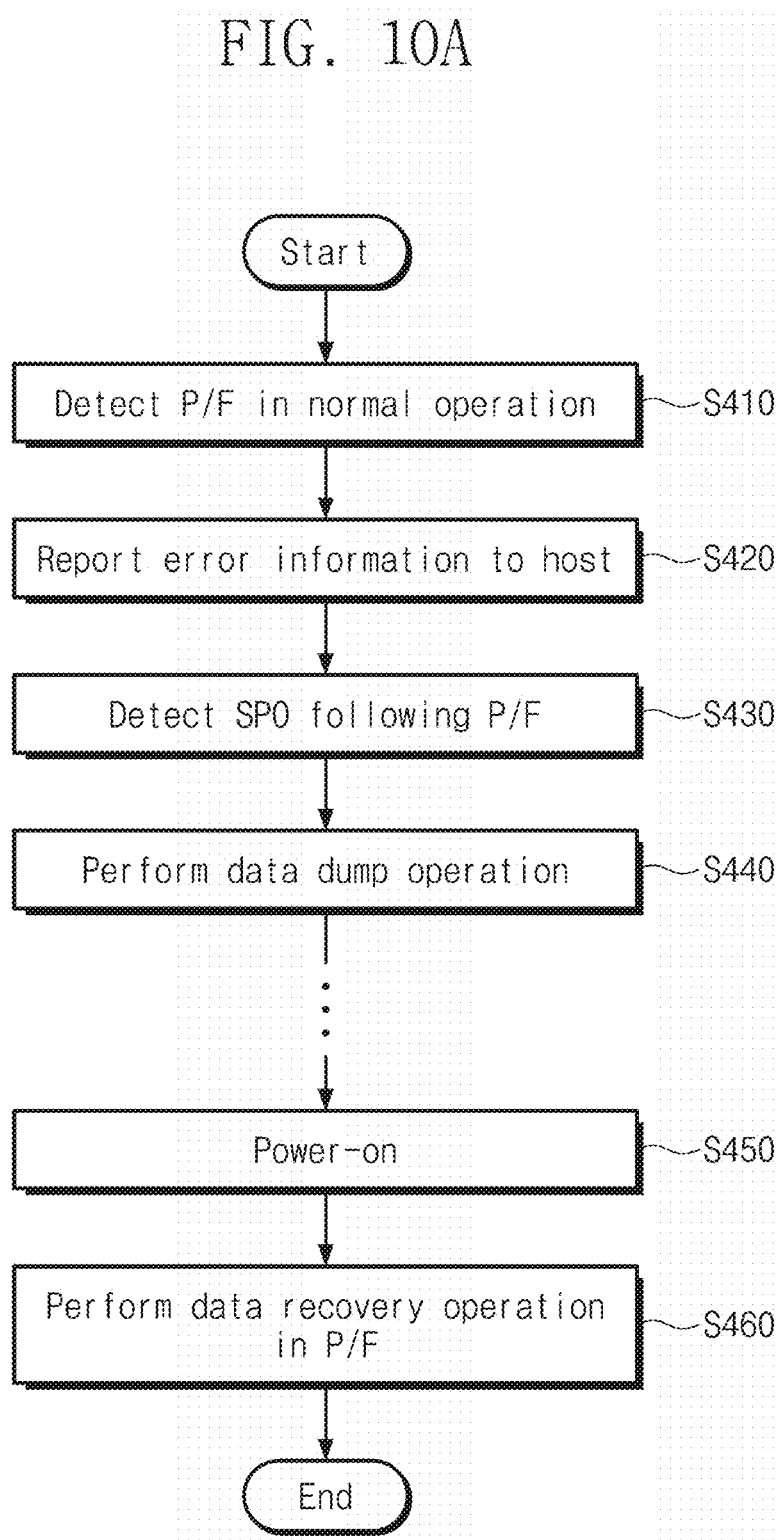

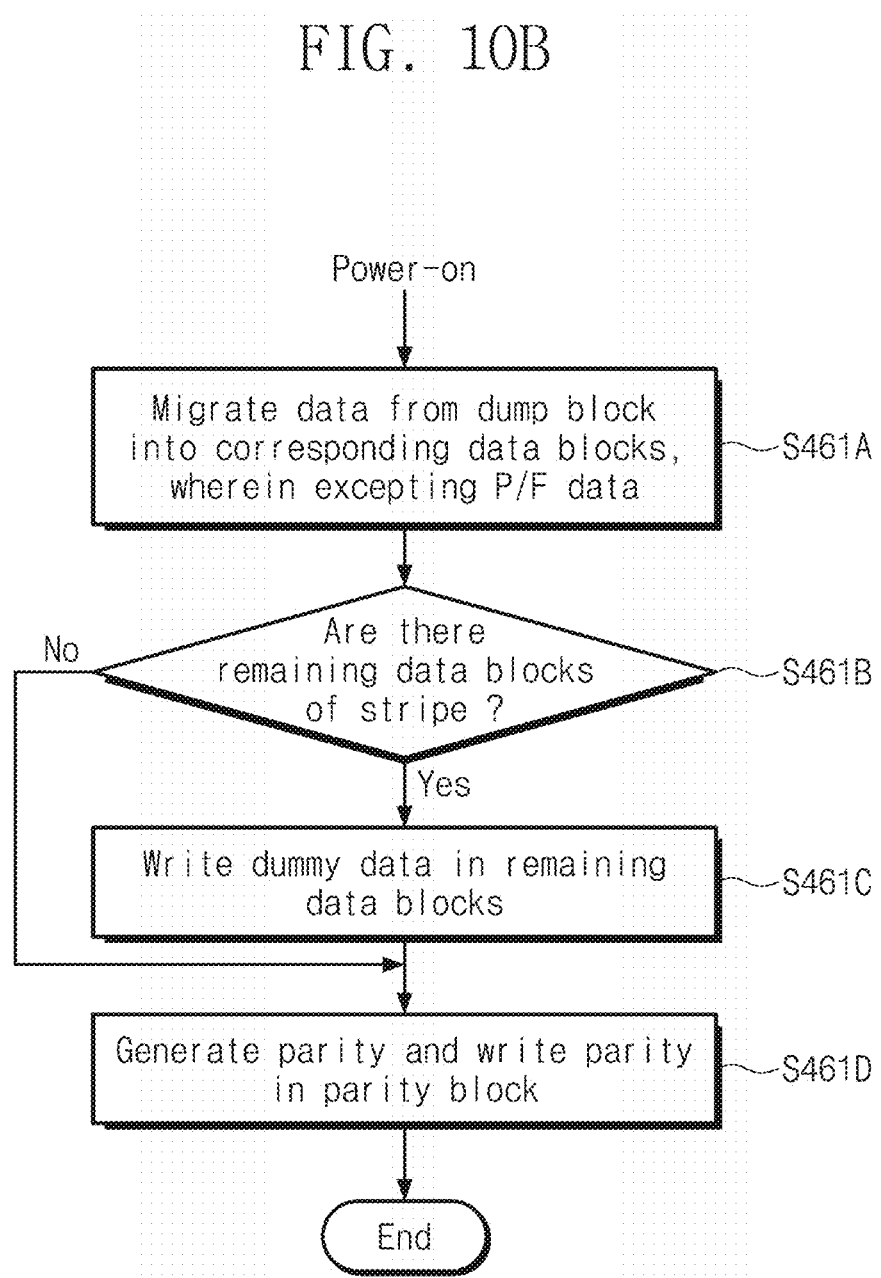

OPERATION METHOD OF OPEN-CHANNEL STORAGE DEVICE

CROSS-REFERENCE TO RELATED APPLICATIONS

This application claims priority under 35 U.S.C. § 119 to Korean Patent Application No. 10-2019-0031649 filed on Mar. 20, 2019, in the Korean Intellectual Property Office, the disclosures of which are incorporated by reference herein in their entireties.

TECHNICAL FIELD

Example embodiments of the inventive concepts described herein relate to semiconductor memories, and more particularly, relate to operation methods of open-channel storage devices.

BACKGROUND

A semiconductor memory device is classified as a volatile memory device, in which stored data disappear when a power is turned off, such as a static random access memory (SRAM) or a dynamic random access memory (DRAM), or a nonvolatile memory device, in which stored data are retained even when a power is turned off, such as a flash memory device, a phase-change RAM (PRAM), a magnetic RAM (MRAM), a resistive RAM (RRAM), or a ferroelectric RAM (FRAM).

The flash memory device is being widely used as a high-capacity storage medium. However, a separate management means for managing the flash memory device efficiently may be desired because of a physical characteristic of the flash memory device. A flash translation layer (FTL) of a flash memory device-based solid state drive (SSD) is widely used as the management means. In a conventional SSD, the flash translation layer has been executed by an internal controller of the SSD. However, nowadays, a host-level flash translation layer that is configured such that a host controls overall operations of the SSD may be desirable.

SUMMARY

Example embodiments of the inventive concepts provide operation methods of open-channel storage devices having improved reliability.

At least some example embodiments relate to an open-channel storage device being configured to be controlled by a host, the open-channel storage device including a buffer memory and a nonvolatile memory device. An operation method of the open-channel storage device includes performing a normal operation under a control of the host, detecting a sudden power-off immediately after a program failure associated with a first data block among a plurality of memory blocks included in the nonvolatile memory device while the normal operation is performed, dumping a plurality of user data stored in the buffer memory to a dump block among the plurality of memory blocks in response to the detected sudden power-off, detecting a power-on, and performing a data recovery operation on the plurality of user data stored in the dump block in response to the detected power-on.

At least some example embodiments relate to an open-channel storage device being configured to be controlled by a host, the open-channel storage device including a buffer memory and a nonvolatile memory device. An operation method of the open-channel storage device includes performing a normal operation under control of the host, detecting a sudden power-off while the normal operation is performed, dumping a plurality of user data stored in the buffer memory to a dump block among a plurality of memory blocks included in the nonvolatile memory device in response to the detected sudden power-off, detecting a power-on, performing a first data recovery operation on the plurality of user data from the dump block in response to the detected power-on, detecting a program failure associated with a first data block among the plurality of memory blocks during the first data recovery operation, and performing a second data recovery operation different from the first data recovery operation in response to the detected program failure.

At least some example embodiments relate to an open-channel storage device configured to be controlled by a host including a bad block manager, and the open-channel storage device including a buffer memory and a nonvolatile memory device An operation method of the open-channel storage device includes performing a normal operation under control of the host, detecting a normal power-off during the normal operation, performing a data flush operation of respectively storing a plurality of user data stored in the buffer memory in corresponding data blocks among a plurality of memory blocks included in the nonvolatile memory device, in response to the detected normal power-off, detecting a program failure associated with a first data block among the plurality of memory blocks included in the nonvolatile memory device during the data flush operation, transmitting error information to the host in response to the detected program failure, generating parity data based on first user data to be stored in a first memory block of the plurality of memory blocks, second user data corresponding to the first user data, and at least one dummy data, and storing the parity data in a corresponding parity block among the plurality of memory blocks.

BRIEF DESCRIPTION OF THE FIGURES

The above and other objects and features of some of the example embodiments of the inventive concepts will become apparent by describing in detail some example embodiments thereof with reference to the accompanying drawings.

FIG. 6 is a flowchart illustrating an operation for data recovery after a sudden power-off of a storage device of FIG. 1.

FIG. 10A to 10C are flowcharts illustrating an operation of a storage device of FIG. 1.

DETAILED DESCRIPTION

Below, example embodiments of the inventive concepts may be described in detail and clearly to such an extent that an ordinary one in the art easily implements the inventive concept.

Figure 1:
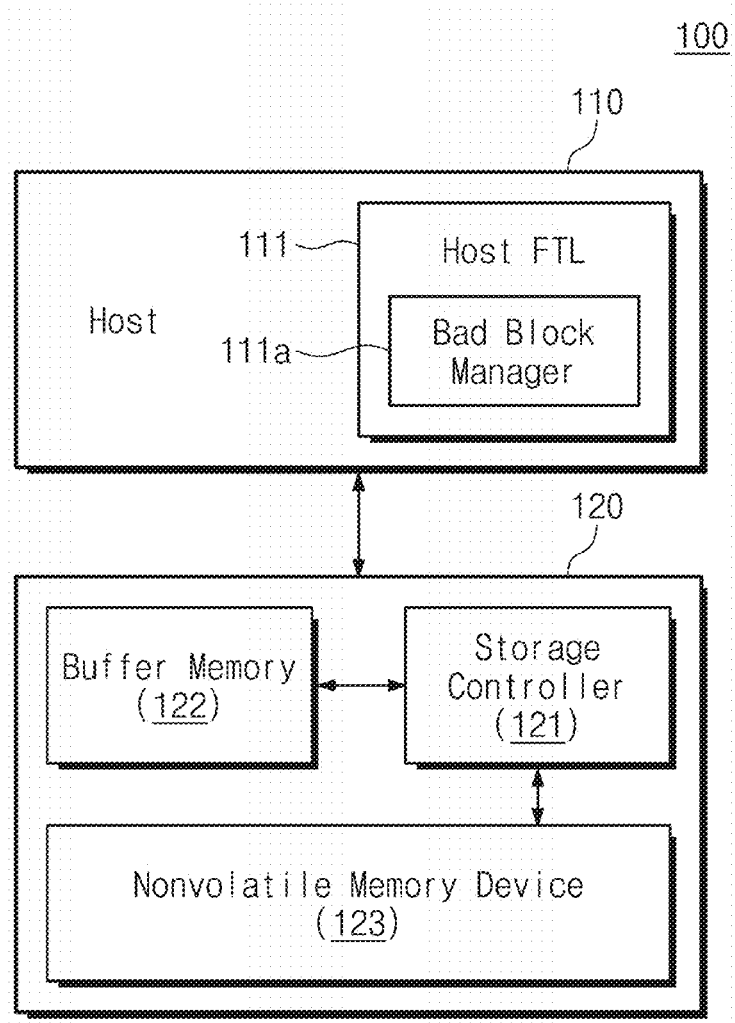
FIG. 1 is a block diagram illustrating a computing system according to an example embodiment.

FIG. 1 is a block diagram illustrating a computing system according to an example embodiment. Referring to FIG. 1, a computing system 100 may include a host 110 and a storage device 120. In an example embodiment, the computing system 100 may include one of various computing systems such as a personal computer, a notebook, a server, a workstation, a smartphone, and a tablet.

The host 110 may be configured to control the storage device 120. For example, the host 110 may store data in the storage device 120 or may read data stored in the storage device 120.

The storage device 120 may be configured to operate under the control of the host 110. For example, the storage device 120 may include a storage controller 121, a buffer memory 122, and a nonvolatile memory device 123.

The storage controller 121 may be configured to control the buffer memory 122 and the nonvolatile memory device 123. The buffer memory 122 may be configured to store data received from the host 110, data stored in the nonvolatile memory device 123, or a variety of information that is necessary for the storage device 120 to operate. Under the control of the storage controller 121, the nonvolatile memory device 123 may be configured to store data or to output the stored data. In an example embodiment, the nonvolatile memory device 123 may be a NAND flash memory device, but the example embodiments of the inventive concepts are not limited thereto.

The storage controller 121 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In an example embodiment, a conventional storage device efficiently manages a nonvolatile memory device by using a separate management means (e.g., a flash translation layer FTL). The flash translation layer is configured to perform various operations for managing the nonvolatile memory device efficiently, for example, an address translation operation, a garbage collection operation, a bad block management operation, and a wear-leveling operation. That is, the conventional storage device efficiently manages the nonvolatile memory device by internally executing the flash translation layer.

However, according to an example embodiment, the flash translation layer may be included in the host 110. In other words, the host 110 may include a host flash translation layer 111. The host flash translation layer 111 may be configured to perform management operations that have been internally performed in the conventional storage device.

In an example embodiment, as the host flash translation layer 111 is executed by the host 110, the storage device 120 may be configured to receive a physical address indicating a location of an actual storage area of the nonvolatile memory device 123 from the host 110. That is, the storage controller 121 of the storage device 120 may receive a physical address from the host 110 and may perform an operation on a location corresponding to the received physical address. That is, the storage device 120 may be an open-channel solid state drive (OC-SSD). Below, for convenience of description, the term of "storage device" may be used, but a storage device may refer to an open-channel SSD.

In an example embodiment, the host flash translation layer 111 may include a bad block manager 111a. The bad block manager 111a may be configured to manage a bad block among a plurality of memory blocks included in the nonvolatile memory device 123. For example, when a bad block is detected from the plurality of memory blocks included in the nonvolatile memory device 123, the bad block manager 111a of the host flash translation layer 111 may replace the bad block with a normal block.

In an example embodiment, because bad blocks of the nonvolatile memory device 123 are managed by the bad block manager 111a of the host flash translation layer 111, when a bad block occurs in the nonvolatile memory device 123 under a certain condition, data stored in the bad block or data to be stored in the bad block may be lost.

According to an example embodiment, under the certain condition, the storage device 120 may secure the integrity of data with regard to data stored in the nonvolatile memory device 123 or data to be stored in the nonvolatile memory device 123. How the storage device 120 according to an example embodiment secures the integrity of data will be described with reference to accompanying drawings.

Figure 2:
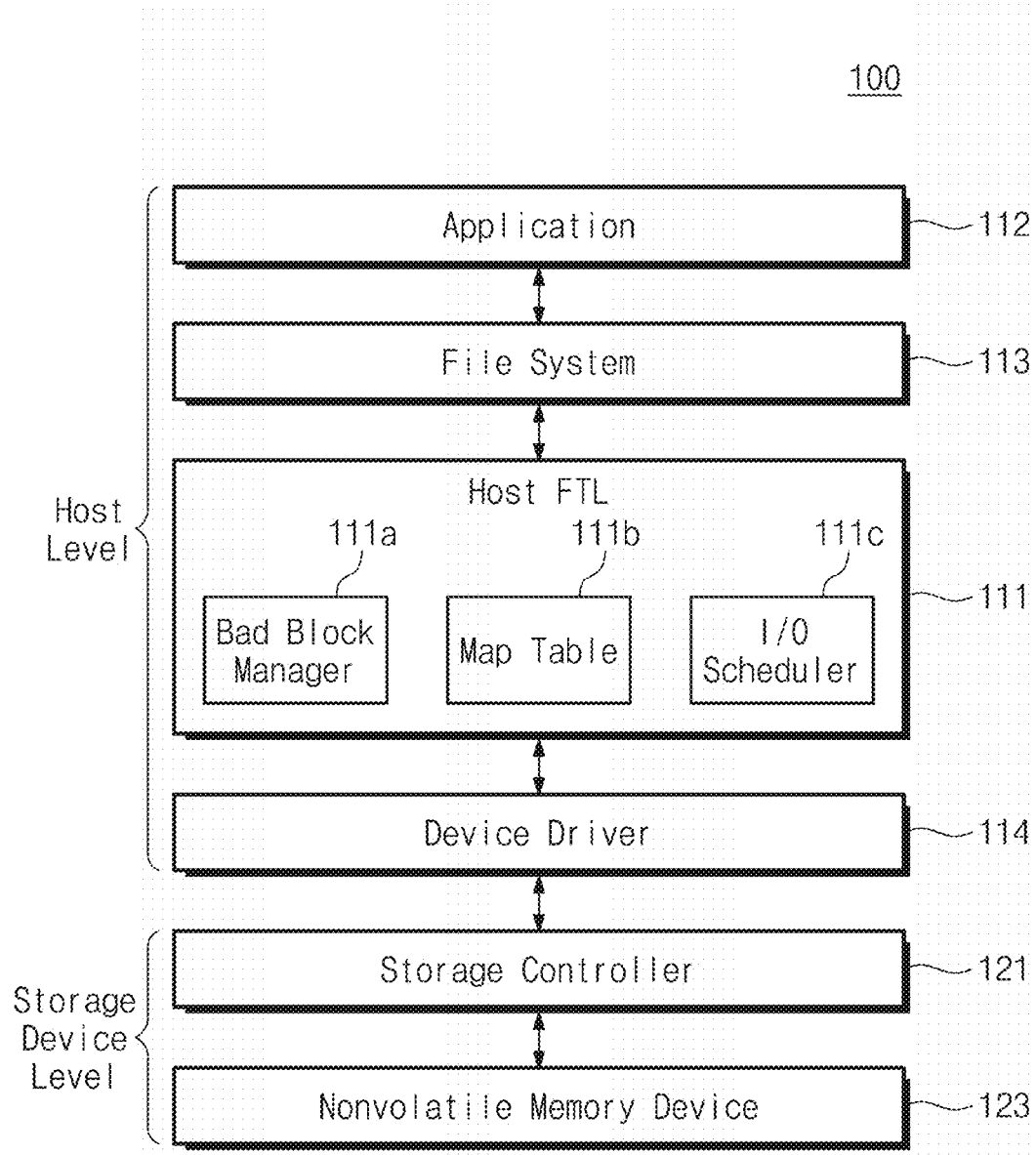
FIG. 2 is a diagram illustrating layers of a computing system of FIG. 1.

FIG. 2 is a diagram illustrating layers of a computing system of FIG. 1. Referring to FIGS. 1 and 2, layers of the host 110 may include the host flash translation layer 111, an application 112, a file system 113, and a device driver 114.

The application 112 may indicate a variety of software that is driven on the host 110. The file system 113 may perform a role of organizing files or data that are used by applications. For example, the file system 113 may manage a storage space of the storage device 120 by using logical addresses. In an example embodiment, the file system 113 may have a type that is variable with an operating system driven on the host 110. For example, the file system 113 may include one of various file systems such as FAT (File Allocation Table), FAT32, NTFS (NT File System), HFS (Hierarchical File System), JSF2 (Journaled File System2), XFS, ODS-5 (On-Disk Structure-5), UDF, ZFS, UFS (Unix File System), ext2, ext3, ext4, ReiserFS, Reiser4, ISO 9660, Gnome VFS, BFS, and WinFS.

The host flash translation layer 111 may provide an interface between a logical address managed by the file system 113 and a physical address of the nonvolatile memory device 123 included in the storage device 120.

For example, the host flash translation layer 111 may perform an address translation operation between a logical address and a physical address, based on a map table 111b including information about a correspondence relationship between the logical address and the physical address. Alternatively, the host flash translation layer 111 may be configured to replace a bad block detected in the nonvolatile memory device 123 with a normal block, by using the bad block manager 111a. Alternatively, the host flash translation layer 111 may be configured to perform scheduling of an I/O to be provided to the storage device 120, by using an I/O scheduler 111c. However, the example embodiments of the inventive concepts are not limited thereto. For example, the host flash translation layer 111 may perform various operations, which may efficiently manage the nonvolatile memory device 123 of the storage device 120, such as a garbage collection operation and a wear-leveling operation.

The device driver 114 may be configured to perform an operation of translating information from the host flash translation layer 111 into information that is recognizable by the storage device 120.

In an example embodiment, the application 112, the file system 113, the host flash translation layer 111, and the device driver 114 that are described above may be implemented in the form of software, and may be executed by processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Based on information from the device driver 114 of the host 110, the storage controller 121 may be configured to store data in the nonvolatile memory device 123 or to transmit data stored in the nonvolatile memory device 123 to the host 110.

In an example embodiment, as described above, because a logical address is translated into a physical address by the host flash translation layer 111, the storage controller 121 may receive the physical address from the device driver 114 of the host 110. The storage controller 121 may perform a read/write/erase operation on a storage space (i.e., a physical storage space of the nonvolatile memory device 123) corresponding to the received physical address.

Figure 3:
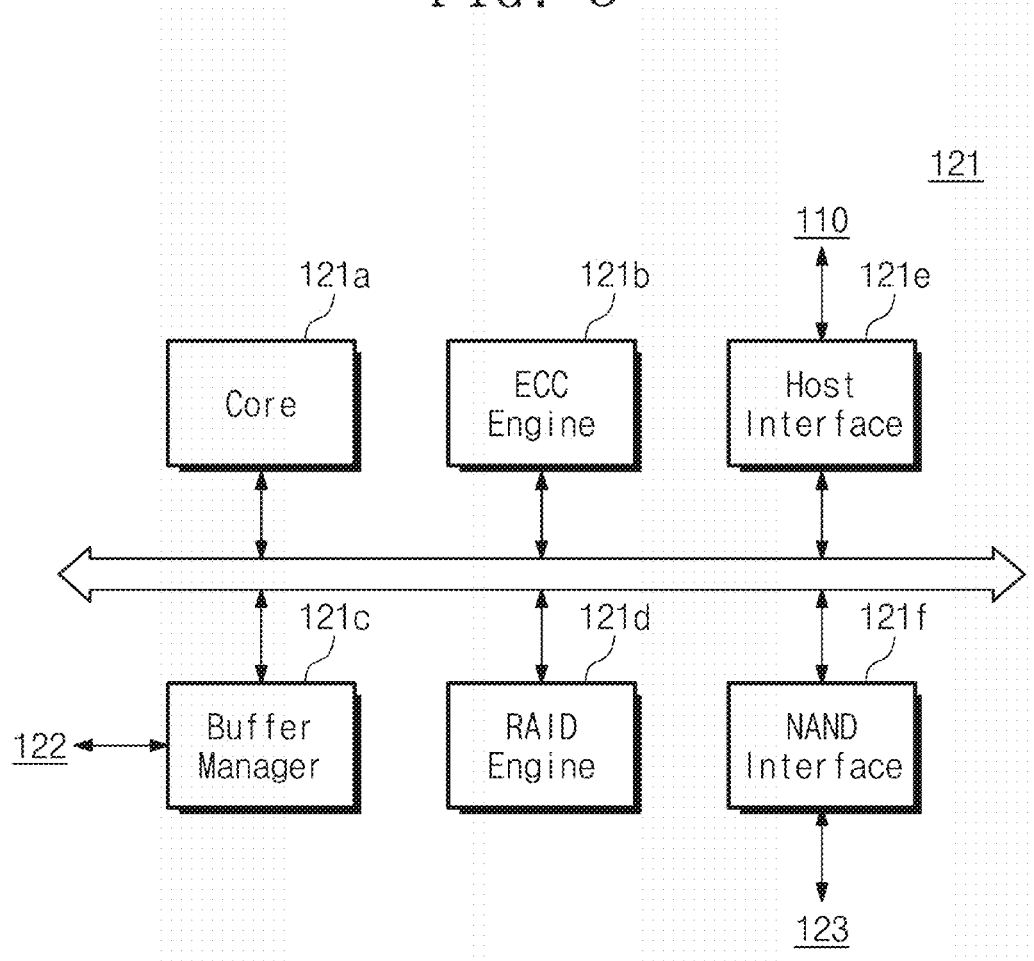
FIG. 3 is a block diagram illustrating a storage controller of FIG. 1.

FIG. 3 is a block diagram illustrating a storage controller of FIG. 1. Referring to FIGS. 1 and 3, the storage controller 121 may include a core 121a, an error correction code (ECC) engine 121b, a buffer manager 121c, an RAID engine 121d, a host interface 121e, and a NAND interface 121f.

The core 121a may be configured to control overall operations of the storage controller 121. The ECC engine 121b may be configured to detect and correct an error of data read from the nonvolatile memory device 123. The buffer manager 121c may be configured to manage or control the buffer memory 122.

The RAID engine 121d may be configured to generate parity data for data to be stored in the nonvolatile memory device 123. For example, a plurality of data may be stored in the nonvolatile memory device 123. In this case, the plurality of data may constitute one stripe. The RAID engine 121d may perform an operation or a calculation on data included in one stripe to generate parity data for the stripe.

In detail, when one stripe includes 7 unit data, the RAID engine 121d may perform an XOR operation on the 7 unit data to generate one parity data having the same size as one unit data. In this case, one stripe may include 7 unit data and one parity data. In an example embodiment, the number of unit data included in one stripe and the number of parity data included therein may be determined by an RAID policy of the RAID engine 121d.

In an example embodiment, when it is impossible to identify any one unit data of the 7 unit data (i.e., when an error is not corrected by the ECC engine 121b), the uncorrectable unit data may be recovered based on the remaining 6 unit data and one parity data.

In an example embodiment, a plurality of unit data included in one stripe may be respectively stored in different memory blocks (or different banks), and parity data corresponding to the one stripe may be stored in a parity block (or a parity bank). In an example embodiment, a memory block (or a bank) in which unit data are stored and a parity block (or a parity bank) in which parity data are stored may be variously changed according to a given RAID policy. In an example embodiment, a memory block (or a bank) in which unit data are stored and a parity block (or a parity bank) in which parity data are stored may be designated by the host flash translation layer 111.

The storage controller 121 may communicate with the host 110 through the host interface 121e. In an example embodiment, the host interface 121e may be an NVMe (Nonvolatile Memory express) interface, but the example embodiments of the inventive concepts are not limited thereto. For example, the host interface 121e may include at least one of various interfaces such as a SATA (Serial ATA) interface, a PCIe (Peripheral Component Interconnect Express) interface, a SAS (Serial Attached SCSI) interface, and an UFS (Universal Flash Storage) interface.

The storage controller 121 may communicate with the nonvolatile memory device 123 through the NAND interface 121f.

Figure 4:
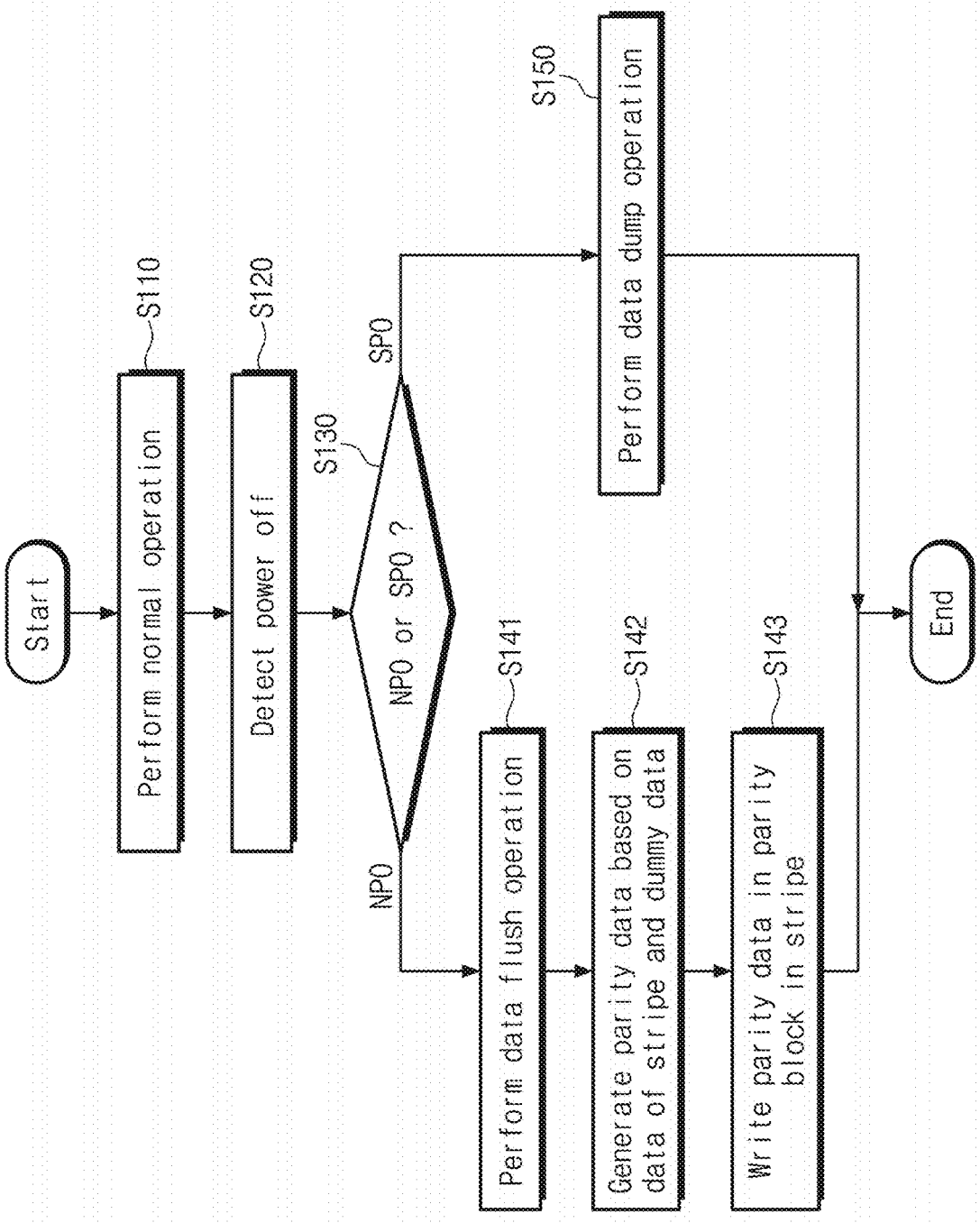
FIG. 4 is a flowchart illustrating an operation of a storage device of FIG. 1.

FIG. 4 is a flowchart illustrating an operation of a storage device of FIG. 1. FIGS. 5A to 5D are diagrams for describing an operation according to the flowchart of FIG. 4. Below, for convenience of description, components that are unnecessary to describe an operation of the storage device 120 are omitted.

For example, for brevity of illustration and convenience of description, it is assumed that the nonvolatile memory device 123 includes 0-th to eighth memory blocks BLK0 to BLK8. It is assumed that each of the 0-th to sixth memory blocks BLK0 to BLK6 is a data block "D" storing user data received from the host 110 and the seventh memory block BLK7 is a parity block "P" configured to store parity data generated by the RAID engine 121d. That is, one stripe may include 7 user data and one parity data, and the 7 user data and the one parity data included in the one stripe may be respectively stored in the 0-th to seventh memory blocks BLK0 to BLK7.

Also, it is assumed that an eighth memory block BLK8 may be a dump block DP used to dump data stored in the buffer memory 122 under a certain condition (e.g., a sudden power-off condition). In an example embodiment, the dump block DP may be a storage space that is not recognized by the host 110.

In an example embodiment, the 0-th to seventh memory blocks BLK0 to BLK7 may be included in different banks, respectively. Each of memory cells included in each of the 0-th to seventh memory blocks BLK0 to BLK7 may be a multi-level cell configured to store "n" bits ("n" being an integer of 2 or more). Each of the memory cells included in the eighth memory block BLK8 may be a single level cell configured to store one bit or may be a multi-level cell configured to store "m" bits ("m" being an integer smaller than "n") That is, a program speed of the eighth memory block BLK8 may be higher or faster than a program speed of each of the 0-th to seventh memory blocks BLK0 to BLK7.

The above components are an example for describing embodiments of the inventive concept clearly, and the example embodiments of the inventive concepts are not limited thereto.

Referring to FIGS. 1 and 4, in operation S110, the storage device 120 may perform a normal operation. For example, as illustrated in FIG. 5A, the storage device 120 may perform a normal write operation under control of the host 110.

Figure 5A:
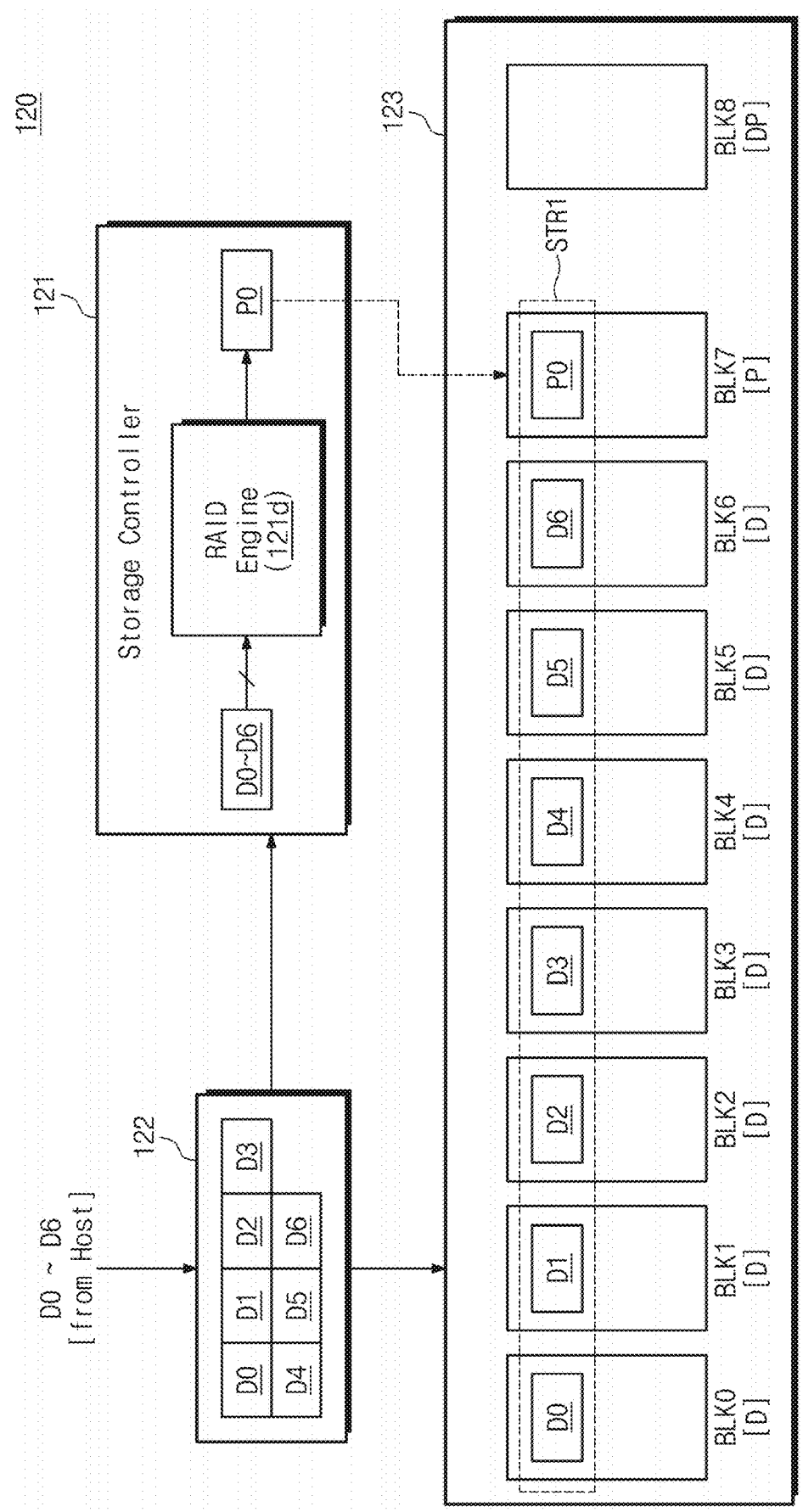
FIGS. 5A to 5D are diagrams for describing an operation according to a flowchart of FIG. 4.

In detail, referring to FIG. 5A, the storage device 120 may receive 0-th to sixth user data D0 to D6 from the host 110. The 0-th to sixth user data D0 to D6 thus received may be stored in the buffer memory 122.

In an example embodiment, although not illustrated in drawings, when the 0-th to sixth user data D0 to D6 are normally stored in the buffer memory 122, the storage controller 121 of the storage device 120 may transmit, to the host 110, a completion response providing notification that the 0-th to sixth user data D0 to D6 are normally received. The host 110 may recognize that the 0-th to sixth user data D0 to D6 are normally stored in the storage device 120, based on the completion response.

The storage controller 121 may store the 0-th to sixth user data D0 to D6 stored in the buffer memory 122 in the 0-th to sixth memory blocks BLK0 to BLK6 being corresponding data blocks "D". In this case, the RAID engine 121*d* of the storage controller 121 may generate 0-th parity data P0 based on the 0-th to sixth user data D0 to D6. The storage controller 121 may store the 0-th parity data P0 in the seventh memory block BLK7 being the parity block "P".

That is, a first stripe STR1 may include the 0-th to sixth user data D0 to D6 and the 0-th parity data P0, and an operation in which respective data included in the first stripe STR1 are stored in corresponding memory blocks may be the normal write operation. In an example embodiment, the normal write operation may be performed by the host 110, and a physical location where individual user data are stored may be designated by the host flash translation layer 111 of the host 110.

As described above, because the first stripe STR1 includes the 0-th parity data P0, even though any one (e.g., D2) of pieces of user data included in the first stripe STR1 is not identified (e.g., even though an error is not corrected by the ECC engine 121*b*), the second user data D2 may be recovered based on the remaining user data D0, D1, and D3 to D6 and the 0-th parity data P0.

Returning to FIG. 4, in operation S120, the storage device 120 may detect a power-off. For example, while the normal operation described with reference to FIG. 5A is performed, the storage device 120 may detect the power-off PO. In an example embodiment, the power-off PO may include a normal power-off NPO by a power-off signal received from the host 110 and a sudden power-off SPO by sudden power interruption.

Figure 5B:
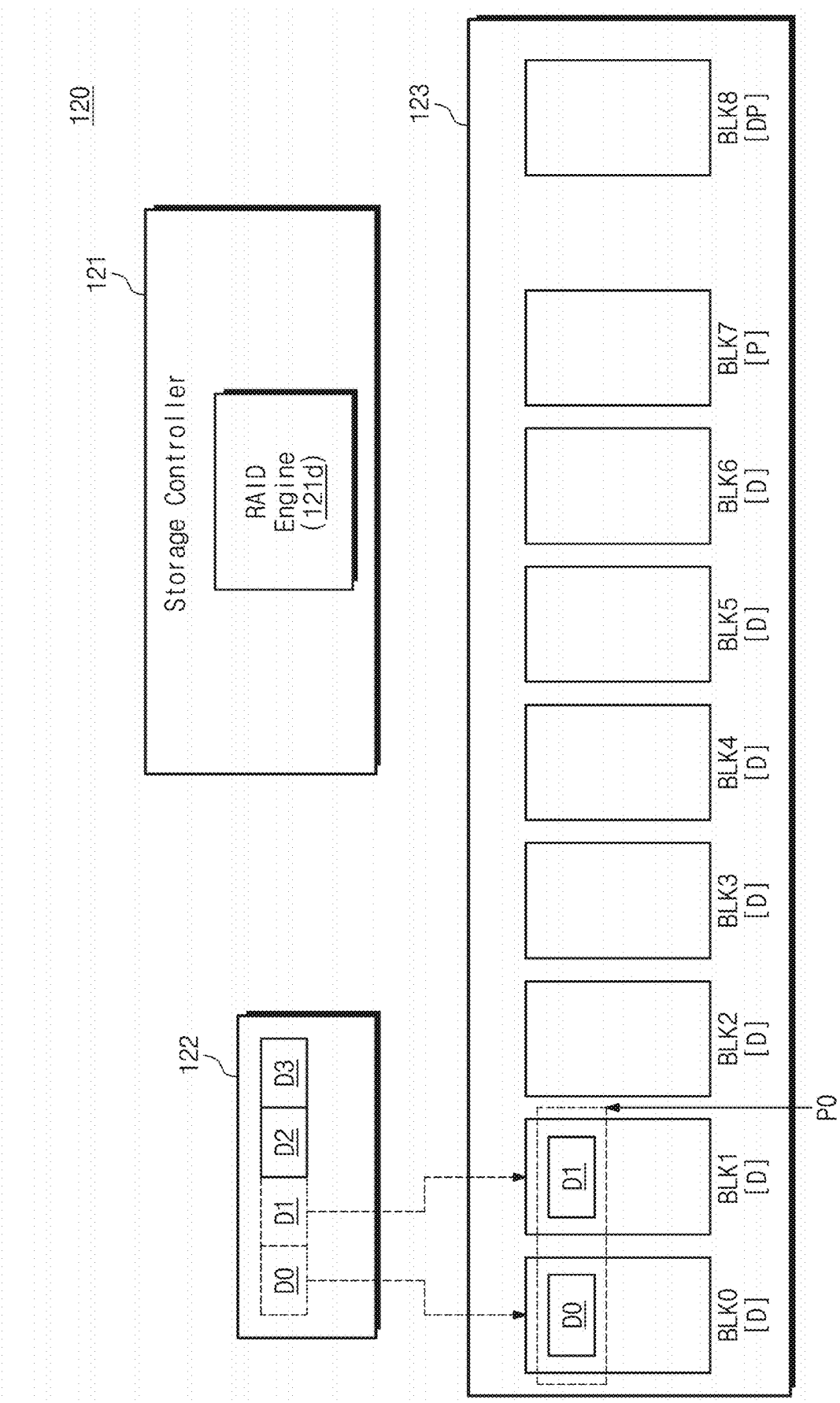

For example, it is assumed that the buffer memory 122 stores the 0-th to third user data D0 to D3 received from the host 110, as illustrated in FIG. 5B. In this case, because the host 110 recognizes that the 0-th to third user data D0 to D3 are normally written, the reliability for the 0-th to third user data D0 to D3 may have to be secured.

The power-off PO may be detected after the 0-th and first user data D0 and D1 are respectively stored in the 0-th and first memory blocks BLK0 and BLK1 being the corresponding data blocks "D". In this case, because the second and third user data D2 and D3 are not yet stored in the nonvolatile memory device 123, the second and third user data D2 and D3 may be maintained in the buffer memory 122.

Returning to FIG. 4, in operation S130, the storage device 120 may determine whether the detected power-off is the normal power-off NPO or the sudden power-off SPO. For example, when the detected power-off is the normal power-off NPO, the storage device 120 may receive information about the normal power-off NPO from the host 110. In contrast, when the detected power-off is the sudden power-off SPO, a power supply voltage that is supplied to the storage device 120 may be turned off in a state where the storage device 120 does not receive a separate signal from the host 110. The storage device 120 may determine whether the detected power-off is the normal power-off NPO or the sudden power-off SPO, based on a power supply voltage and a signal from the host 110.

When the detected power-off is the normal power-off NPO, the storage device 120 may perform operation S141 to operation S143. In operation S141, the storage device 120 may perform a data flush operation. In operation S142, the storage device 120 may generate parity data based on data of a stripe and dummy data. In operation S143, the storage device 120 may write the generated parity data in a parity block of a stripe. Below, for convenience of description, in the normal power-off NPO, operations in which the storage device 120 stores data stored in the buffer memory 122 in the corresponding data block "D", writes dummy data, and generates parity data are be collectively referred to as the "data flush operation".

Figure 5C:
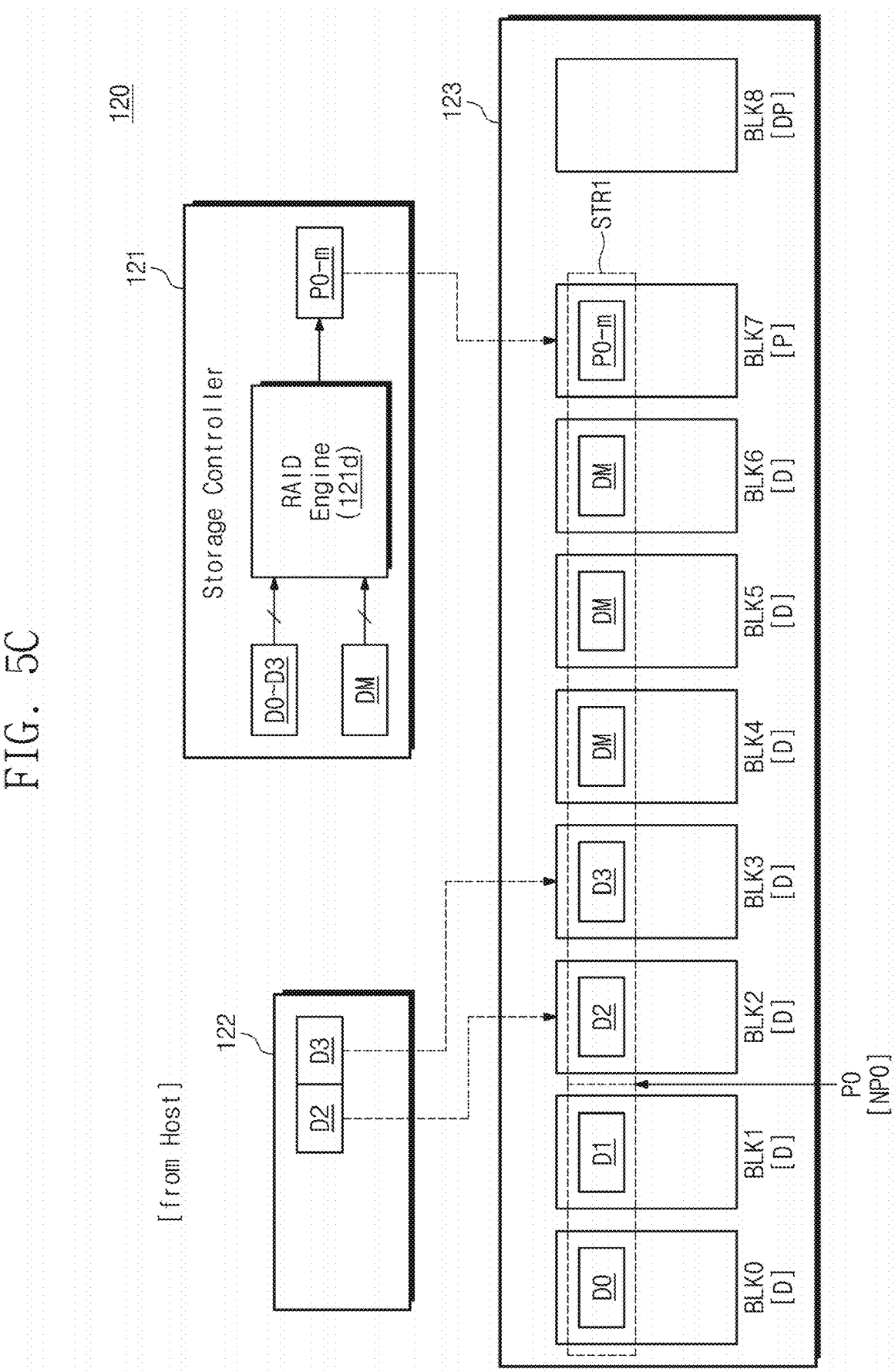

For example, as shown in FIG. 5C, the normal power-off NPO may occur after the 0-th and first user data D0 and D1 are respectively stored in the 0-th and first memory blocks BLK0 and BLK1 being the corresponding data blocks "D". In this case, the storage device 120 may store the second and third user data D2 and D3 stored in the buffer memory 122 in the second and third memory blocks BLK2 and BLK3 being the corresponding data blocks "D", respectively.

In an example embodiment, according to the above assumption, the first stripe STR1 includes 7 user data. In contrast, in the case that the normal power-off NPO occurs, the first stripe STR1 may include only four user data D0, D1, D2, and D3. In this case, dummy data DM may be written in each of the remaining data blocks (e.g., BLK4, BLK5, and BLK6) corresponding to the first stripe STR1. In an example embodiment, the dummy data DM may be a given data pattern or a random data pattern.

That is, in the case where a complete stripe is not formed after user data being maintained in the buffer memory 122 are written in the corresponding data blocks, dummy data may be written in the remaining data blocks of the stripe.

Afterwards, the RAID engine 121*d* of the storage controller 121 may generate parity data P0-*m* based on the user data D0 to D3 included in the first stripe STR1 and the dummy data DM. The parity data P0-*m* may be written in the seventh memory block BLK7 being the parity block "P".

As described above, when the storage device 120 detects the normal power-off NPO during a normal operation, the storage device 120 may respectively write user data being maintained in the buffer memory 122 in the corresponding data blocks and may write dummy data in the remaining data blocks (in other words, data blocks that are not used to construct the stripe). Afterwards, the storage device 120 may generate parity data based on the user data included in the stripe and the dummy data and may write the generated parity data in a parity block. The above operation that is performed after the normal power-off is described with regard to one stripe, but the example embodiments of the inventive concepts are not limited thereto. For example, in the normal power-off NPO, the storage device 120 may perform the above-described operation on each of a plurality of stripes.

Returning to FIG. 4, when the detected power-off is the sudden power-off SPO, in operation S150, the storage device 120 may perform a data dump operation. Below, for convenience of description, an operation of moving user data of the buffer memory 122 to a certain memory block (e.g., the dump block DP) in the sudden power-off SPO is referred to as the "data dump operation".

For example, as illustrated in FIG. 5C, the sudden power-off SPO may occur after the 0-th and first user data D0 and D1 are respectively stored in the corresponding memory blocks BLK0 and BLK1. In this case, the storage device 120 may dump the second and third user data D2 and D3 being maintained in the buffer memory 122 to the eighth memory block BLK8 being the dump block DP. In other words, the storage device 120 may write the second and third user data D2 and D3 stored in the buffer memory 122 in the eighth memory block BLK8.

In an example embodiment, a speed at which the second and third user data D2 and D3 are written in the eighth memory block BLK8 may be higher than a speed at which the second and third user data D2 and D3 are written in the corresponding data blocks. That is, a speed of the data dump operation performed in the sudden power-off SPO may be higher than a speed of the data flush operation performed in the normal power-off NPO.

In an example embodiment, in a dump operation that is performed with regard to the sudden power-off SPO, metadata MD for the second and third user data D2 and D3 may be dumped to the eighth memory block BLK8. The metadata MD may include status information or location information of each of the second and third user data D2 and D3.

Although not illustrated in drawings, the metadata MD may be dumped to any other memory block (e.g., a firmware block) (not shown), but the example embodiments of the inventive concepts are not limited thereto.

As described above, in the normal power-off NPO, the storage device 120 according to an example embodiment may write user data of the buffer memory 122 in the corresponding data blocks and may write dummy data in the remaining data blocks. Afterwards, the storage device 120 may generate parity data based on user data (or dummy data) in the unit of a stripe and may write the generated parity data in a parity block. Accordingly, the integrity of data may be secured in the normal power-off NPO.

Alternatively, in the sudden power-off SPO, the storage device 120 according to an example embodiment may quickly dump user data of the buffer memory 122 to the dump block DP. The storage device 120 may recover data of the dump block DP when a power is turned on after the sudden power-off SPO, thus securing the integrity of data. An operation of recovering data of the dump block DP when a power is turned on after the sudden power-off SPO will be more fully described with reference to FIGS. 6 and 7.

Figure 7:
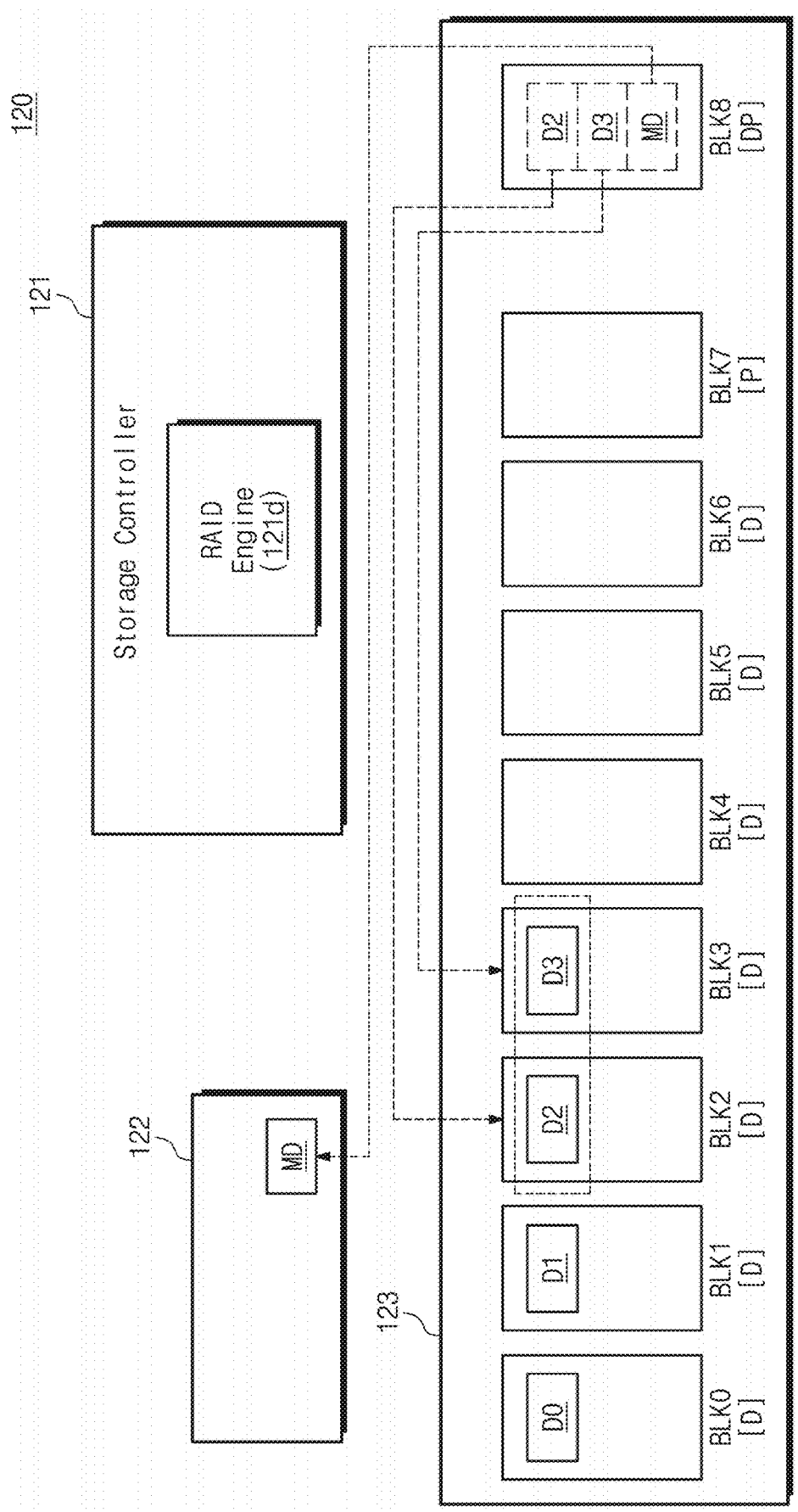
FIG. 7 is a diagram for describing an operation according to a flowchart of FIG. 6.

FIG. 6 is a flowchart illustrating an operation for data recovery after a sudden power-off of a storage device of FIG. 1. FIG. 7 is a diagram for describing an operation according to the flowchart of FIG. 6.

Referring to FIGS. 1, 6, and 7, in operation S210, the storage device 120 may be powered on. In operation S220, the storage device 120 may determine whether a power-off before the power-on is the sudden power-off SPO.

For example, as described with reference to FIG. 4, the storage device 120 may be normally powered off (i.e., NPO) or may be suddenly powered off (i.e., SPO). The storage device 120 may determine whether a previous power-off is the normal power-off NPO or the sudden power-off SPO, with reference to the metadata MD.

When the power-off before the power-on is the normal power-off NPO, in operation S240, the storage device 120 may perform a normal operation. The normal operation is described with reference to operation S110 of FIG. 4 and the operation of FIG. 5A, and thus, additional description will be omitted to avoid redundancy.

When the power-off before the power-on is the sudden power-off SPO, in operation S230, the storage device 120 may perform a data recovery operation. For example, the storage device 120 may be powered on after the sudden power-off SPO described with reference to FIGS. 4 and 5D. In this case, as illustrated in FIG. 7, some user data (e.g., D2 and D3) may be stored in the eighth memory block BLK8 being the dump block DP.

As described above, because the second and third user data D2 and D3 stored in the eighth memory block BLK8 are user data temporarily stored in the eighth memory block BLK8 due to the sudden power-off SPO, the second and third user data D2 and D3 may have to be written in the second and third memory blocks BLK2 and BLK3 being the corresponding data blocks "D".

That is, when a power is turned on after the sudden power-off SPO, the storage device 120 may perform the data recovery operation such that user data (e.g., D2 and D3) stored in the dump block DP migrate to the corresponding data blocks (e.g., BLK2 and BLK3).

In an example embodiment, a location of the dump block DP, at which user data are stored, may be determined based on the metadata MD. For example, in the data recovery operation of the storage device 120, the metadata MD may be loaded onto the buffer memory 122, and the storage controller 121 may determine storage locations (i.e., BLK2 and BLK3) of user data (e.g., D2 and D3) stored in the dump block DP, based on the metadata MD. The storage controller 121 may write user data of the dump block DP at the storage locations determined based on the metadata MD.

In an example embodiment, after the data recovery operation is completed, the dump block DP may be set to a free block for the purpose of any other operation (e.g., a dump operation that is performed by a next sudden power-off).

As described above, the storage device 120 according to an example embodiment may perform the data flush operation (operation S141 to operation S143 of FIG. 4) in the normal power-off NPO, thus securing reliability of user data. Also, the storage device 120 may perform the data dump operation (operation S150 of FIG. 4) in the sudden power-off SPO and may perform the data recovery operation after the sudden power-off SPO, thus securing reliability of user data.

In an example embodiment, a program failure P/F may occur in a certain memory block during the data flush operation performed after the normal power-off NPO, during a normal operation performed immediately before the sudden power-off SPO, or during the data recovery operation performed when a power is turned on after the sudden power-off SPO. Because a conventional storage device internally executes a flash translation layer, the conventional storage device may directly replace a memory block (i.e., a bad block), in which the program failure P/F occurs, with a normal block and may perform a next operation normally.

In contrast, because the storage device 120 (e.g., an open-channel SSD) that is controlled by the host 110 configured to execute the host flash translation layer 111 fails to internally manage a bad block, user data to be written in the bad block may be lost.

When a program failure P/F occurs in a certain memory block during the data flush operation performed after the normal power-off NPO, during a normal operation performed immediately before the sudden power-off SPO, or during the data recovery operation performed when a power is turned on after the sudden power-off SPO, the storage device 120 according to an example embodiment may secure the reliability of data to be stored in the memory block (i.e., a bad block) in which the program failure P/F occurs. Below, a way to secure the reliability of user data of a storage device when the program failure P/F occurs in a certain block under a certain condition will be described with reference to accompanying drawings.

Figure 8:
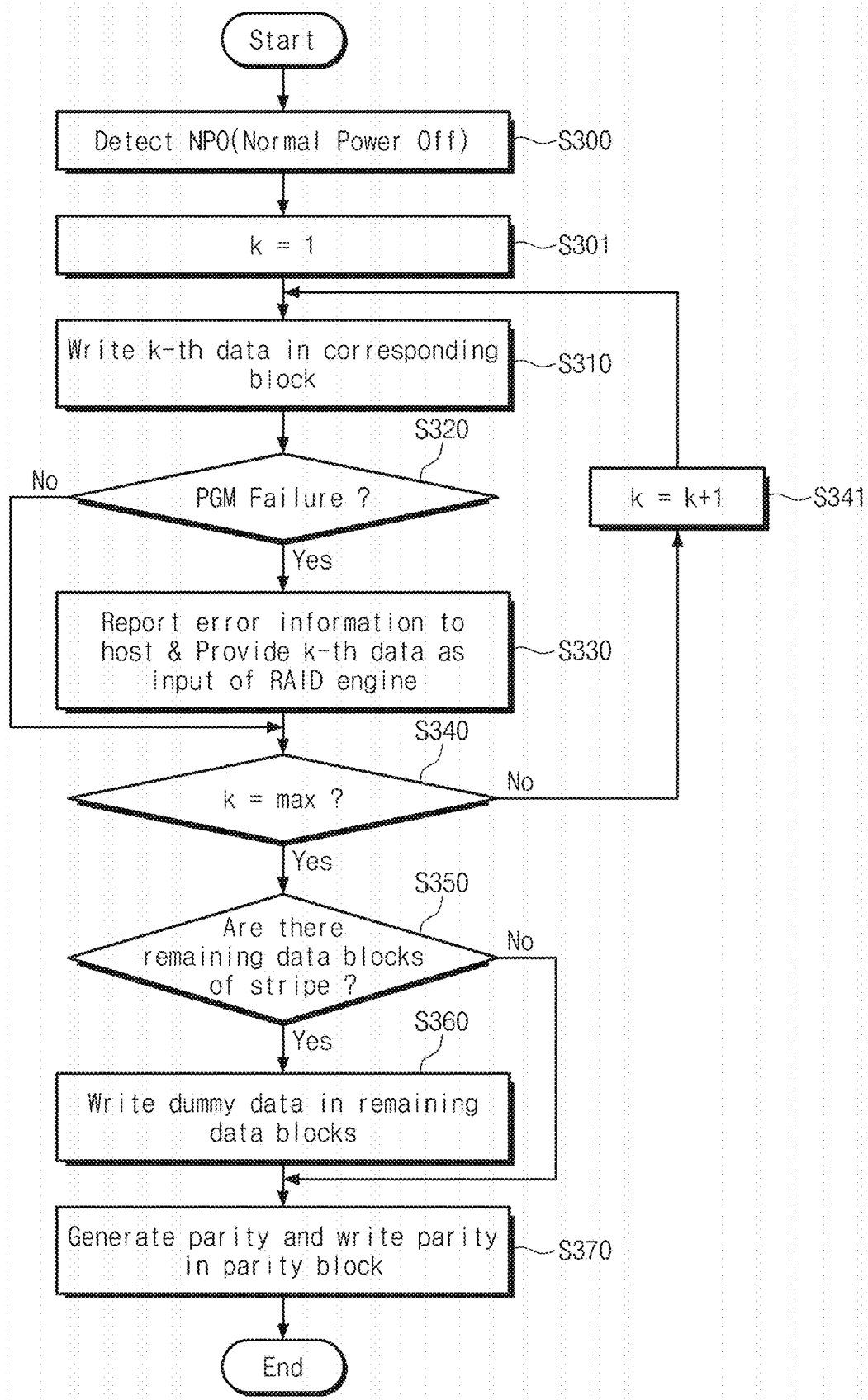
FIG. 8 is a flowchart illustrating an operation of a storage device of FIG. 1.
Figure 9A:
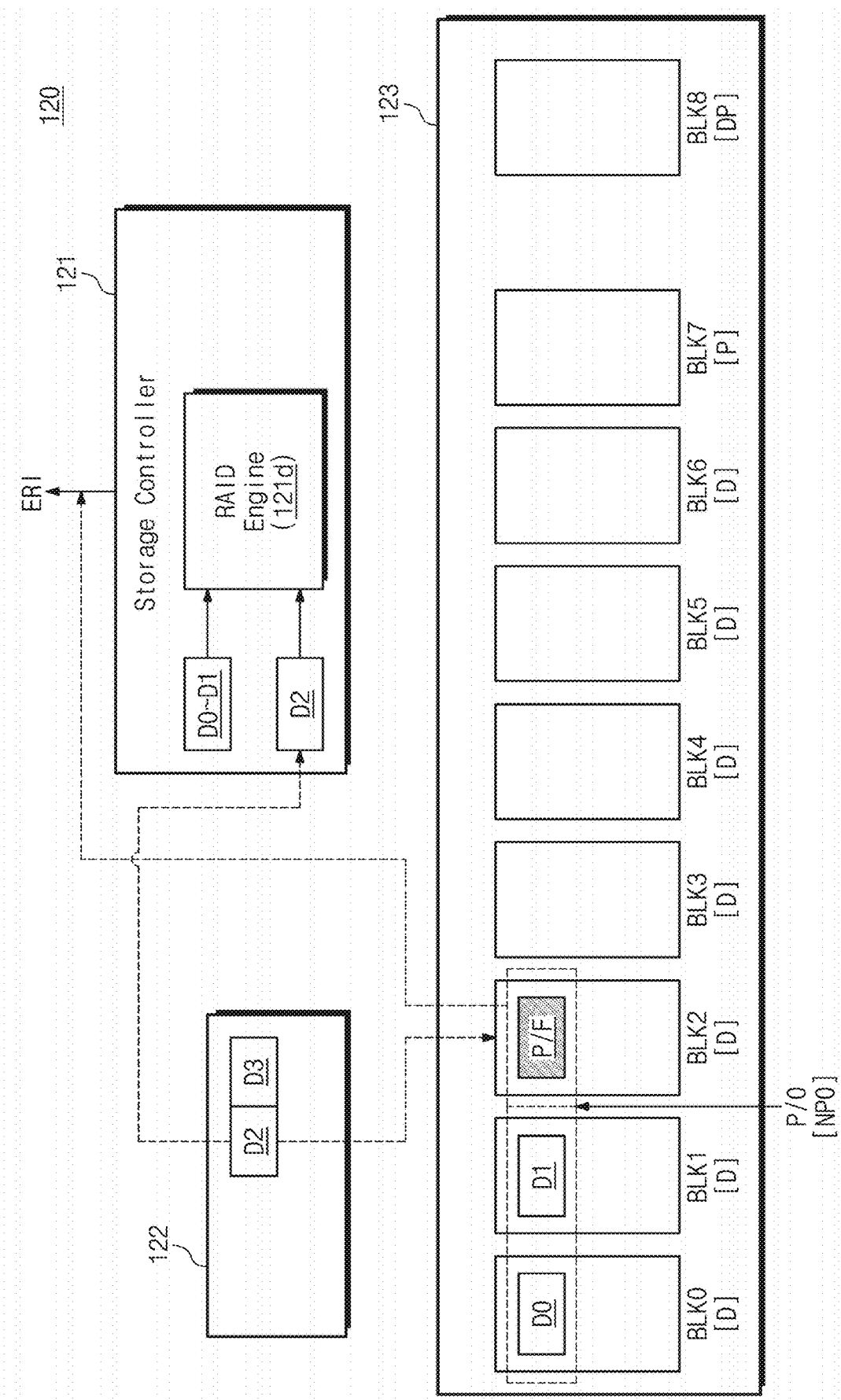
FIGS. 9A to 9C are diagrams for describing an operation according to a flowchart of FIG. 8.
Figure 9B:
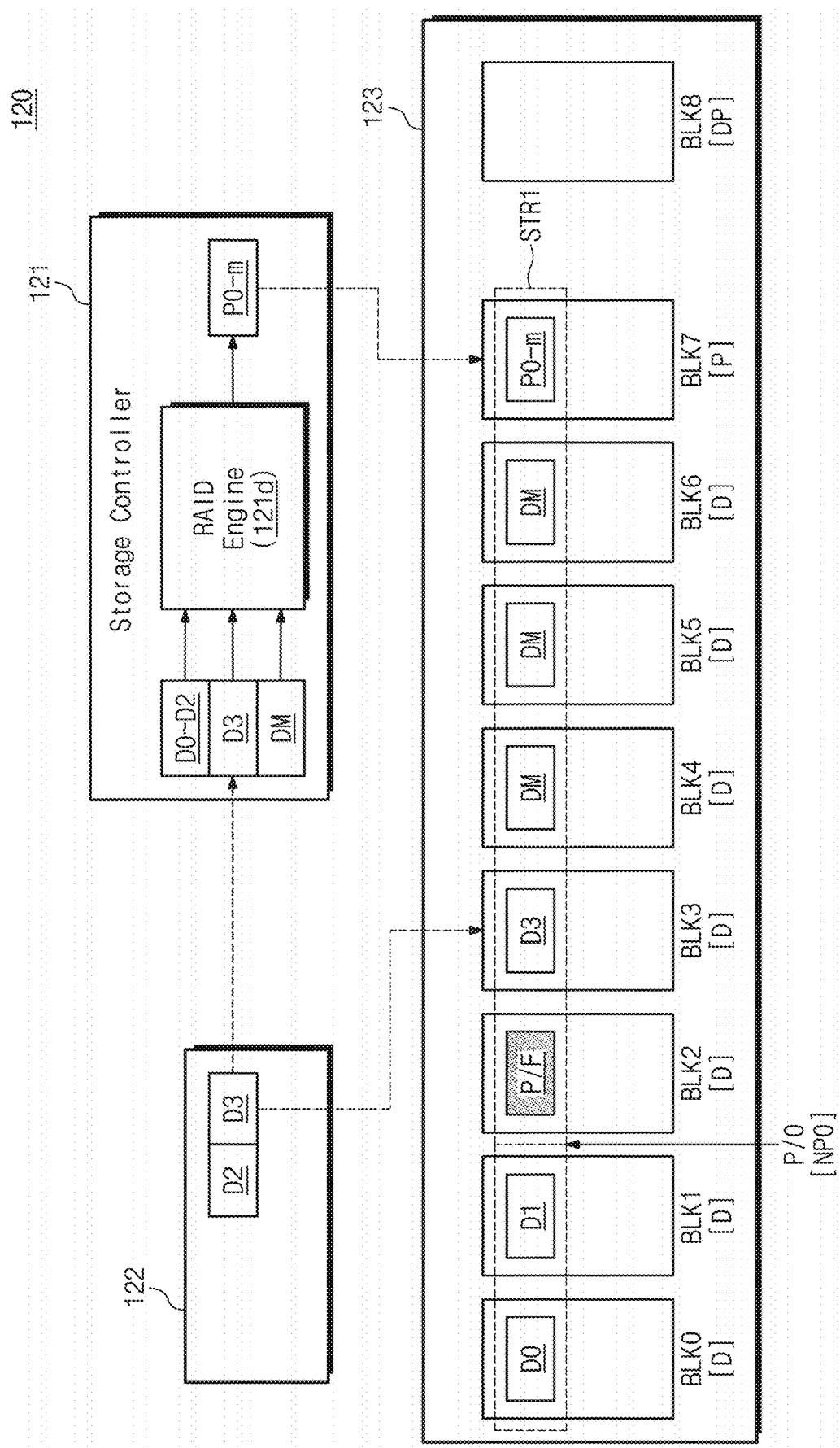
Figure 9C:
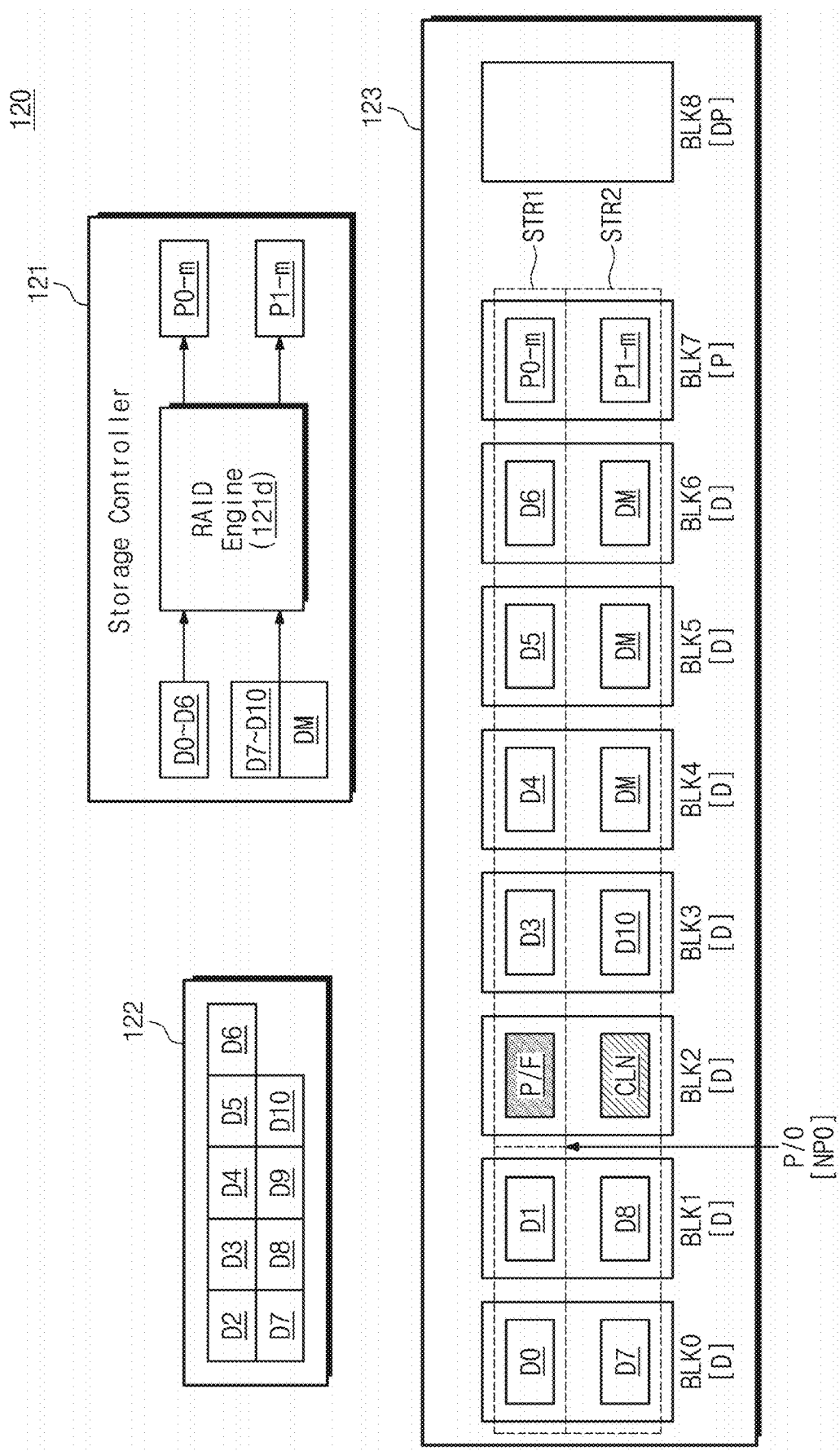

FIG. 8 is a flowchart illustrating an operation of a storage device of FIG. 1. FIGS. 9A to 9C are diagrams for describing an operation according to the flowchart of FIG. 8. An embodiment in which the program failure P/F occurs during the data flush operation performed when the normal power-off NPO occurs will be described with reference to FIGS. 8 and 9A to 9C. For convenience of description, with regard to components that are described above, additional description will be omitted to avoid redundancy. A memory block in which the program failure P/F occurs is referred to as a "bad block", and user data to be stored in the bad block is referred to as "program failure (P/F) data". The embodiment to be described with reference to FIGS. 8 and 9A to 9C is an example for describing the technical idea of the inventive concept easily, and the example embodiments of the inventive concepts are not limited thereto.

Referring to FIGS. 1 and 8, in operation S300, the storage device 120 may detect the normal power-off NPO. Operation S300 is described with reference to operation S120 and operation S130 of FIG. 4, and thus, additional description will be omitted to avoid redundancy.

In operation S301, a variable "k" is set to "1". In an example embodiment, the variable "k" is only for describing an iterative operation of the storage device 120 easily, not intended to limit the inventive concept.

In operation S310, the storage device 120 may write k-th user data of the buffer memory 122 in the corresponding data block. In operation S320, the storage device 120 may determine whether the program failure P/F occurs.

When a determination result of operation S320 indicates that the program failure P/F is detected, in operation S330, the storage device 120 may report to the host 110 on error information ERI and may provide the k-th user data as an input of the RAID engine 121d.

For example, as illustrated in FIG. 9A, the normal power-off NPO may occur after the 0-th and first user data D0 and D1 are respectively stored in the 0-th and first memory blocks BLK0 and BLK1 being the corresponding data blocks "D". In this case, the second and third user data D2 and D3 may be maintained in the buffer memory 122.

In response to the normal power-off NPO, the storage device 120 may write the second user data D2 of the buffer memory 122 in the second memory block BLK2 being the corresponding data block "D". In this case, the program failure P/F may occur during a program operation associated with the second memory block BLK2.

In response to the program failure P/F associated with the second memory block BLK2, the storage controller 121 may transmit the error information ERI to the host 110. In an example embodiment, the error information ERI may be provided as AER completion (Asynchronous Event Request Completion).

In an example embodiment, the host 110 may recognize that the program failure P/F occurs with regard to the second memory block BLK2 (i.e., that the second memory block BLK2 is a bad block), based on the received error information ERI. The host 110 may replace the second memory block BLK2 being a bad block with any other normal block. In an example embodiment, an operation of replacing a bad block may be performed by the bad block manager 111a of the host flash translation layer 111 described with reference to FIGS. 1 and 2.

Without intervention of the host 110, the storage device 120 may provide the second user data D2 (i.e., P/F data) to be stored in the second memory block BLK2, in which the program failure P/F occurs, as an input of the RAID engine 121d.

Returning to FIG. 8, in operation S340, whether the variable "k" is a maximum value may be determined. In an example embodiment, that the variable "k" is the maximum value may mean that all user data maintained in the buffer memory 122 are completely written in the corresponding data blocks (in this case, a bad block may be excluded).

When the variable "k" is not the maximum value, in operation S341, the variable "k" may increase as much as "1", and the storage device 120 may perform operation S310. When the variable "k" is the maximum value, in operation S350, the storage device 120 may determine whether remaining data blocks are present in a stripe.

When the remaining data blocks are present in the stripe, in operation S360, the storage device 120 may write the dummy data DM in the remaining data blocks. When remaining data blocks do not exist or after operation S360, in operation S370, the storage device 120 may generate parity data and may write the parity data in the corresponding parity block.

For example, as illustrated in FIG. 9B, the third user data D3 of the buffer memory 122 may be written in the third memory block BLK3. The third user data D3 thus written may be provided as an input of the RAID engine 121d.

As in the above description, when the first stripe STR1 includes 7 user data and one parity data, 7 user data may be required to generate parity data. In contrast, at a time when the third user data D3 are completely written, because a total of 4 user data D0 to D3 are input to the RAID engine 121d, additional data may be necessary to generate parity data. In this case, the storage device 120 may write the dummy data DM in each of the remaining data blocks (e.g., BLK4, BLK5, and BLK6).

Accordingly, the RAID engine 121d may generate the parity data P0-$m$ based on the 0-th to third user data D0 to D3 and three additional dummy data DM. The generated parity data P0-$m$ may be written in the seventh memory block BLK7 being the parity block "P".

In an example embodiment, as illustrated in FIG. 9B, when the program failure P/F occurs in the second memory block BLK2, the second user data D2 may not be written in the second memory block BLK2. However, the second user data D2 that is not written in the second memory block BLK2 may be recovered based on the parity data P0-$m$ stored in the seventh memory block BLK7 being the parity block "P" and the user data D0, D1, and D3 to D6 stored in the other data blocks BLK0, BLK1, and BLK3 to BLK6.

Accordingly, even though the program failure P/F occurs during the data flush operation that is performed with regard to the normal power-off NPO, later, the host 110 may recover data to be stored in a data block (i.e., a bad block) where the program failure P/F occurs, by using the corresponding parity data.

In an example embodiment, when the normal power-off NPO occurs, the data flush operation may be performed on a plurality of stripes. For example, as illustrated in FIG. 9C, the normal power-off NPO may occur after the 0-th and first user data D0 and D1 are respectively stored in the 0-th and first memory blocks BLK0 and BLK1 being the corresponding data blocks "D". In this case, it is assumed that the buffer memory 122 maintains second to tenth user data D2 to D10.

In this case, in response to the normal power-off NPO, the storage device 120 may store the second to sixth user data D2 to D6 in the corresponding memory blocks BLK2 to BLK6. The program failure P/F may occur in a program operation associated with the second memory block BLK2. In this case, the storage device 120 may generate the parity data P0-$m$ based on the operation method described with reference to FIG. 9B and may write the generated parity data P0-$m$ in the seventh memory block BLK7 being the corresponding parity block "P". That is, the storage device 120 may perform the above operations to construct the first stripe STR1 including the 0-th to sixth user data D0 to D6 and the 0-th parity data P0-$m$.

Afterwards, the storage device 120 may write the remaining user data D7 to D10 in the corresponding memory blocks BLK0 to BLK3. In this case, because the second memory block BLK2 is a bad block, the ninth user data D9 may not be normally written in the second memory block BLK2 (i.e., the probability that the program failure P/F again occurs is high). Accordingly, to improve the integrity of data and an operating speed, the storage device 120 may skip a program operation associated with the second memory block BLK2 being in a program failure (P/F) state. However, the ninth user data D9 to be written in the second memory block BLK2 may be provided as an input of the RAID engine 121$d$.

Afterwards, the storage device 120 may write the tenth user data D10 in the third memory block BLK3 being the corresponding data block "D", may write the dummy data DM in the remaining data blocks BLK4, BLK5, and BLK6, and may generate first parity data P1-$m$ based on the seventh to tenth user data D7 to D10 and the dummy data DM (e.g., three dummy data). The first parity data P1-$m$ thus generated may be written in the seventh memory block BLK7 being the parity block "P". That is, the storage device 120 may perform the above operations to construct a second stripe STR2 including the seventh to tenth user data D7 to D10 and the first parity data P1-$m$.

As described above, when the program failure P/F occurs during the data flush operation that is performed with regard to the normal power-off NPO, the storage device 120 according to an example embodiment may not write user data corresponding to a memory block being in a program failure (P/F) state. Instead, the storage device 120 may generate parity data based on the user data corresponding to the memory block being in the program failure (P/F) state and user data or dummy data included in the corresponding stripe and may write the generated parity data in the parity block "P". As such, the reliability of data that are not normally written due to the program failure P/F may be secured.

Figure 10C:
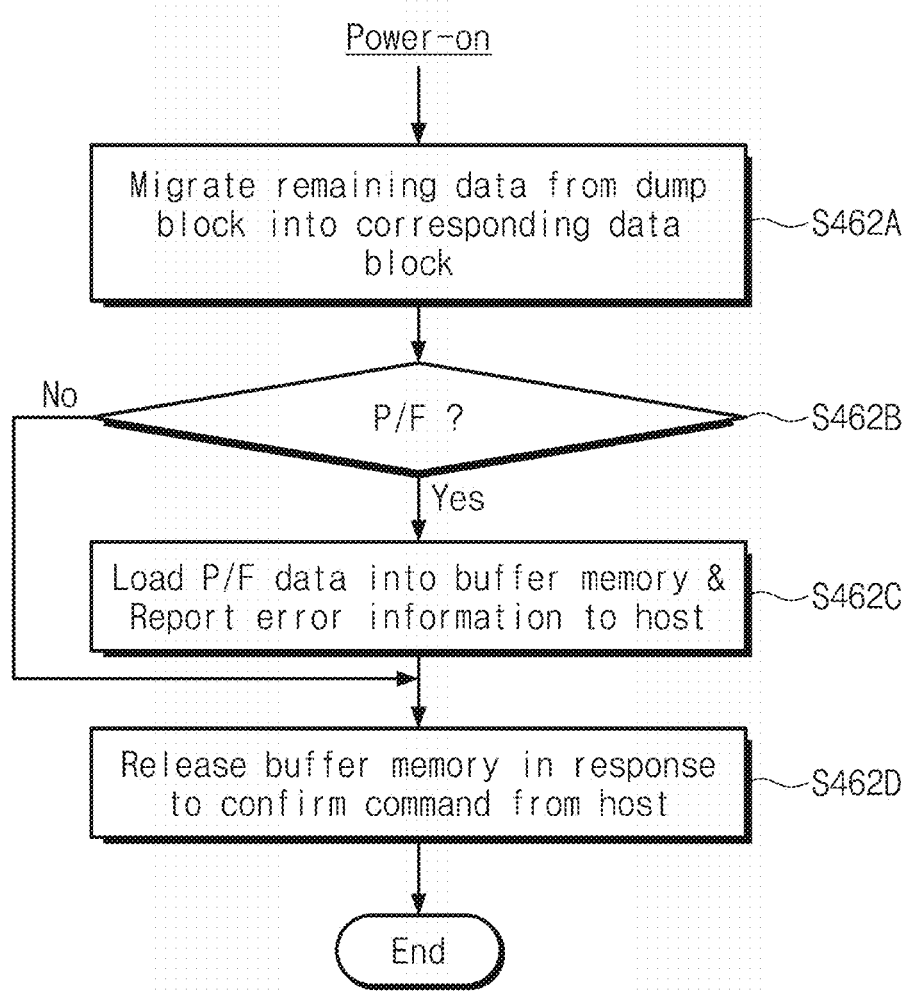

FIG. 10A to 10C are flowcharts illustrating an operation of a storage device of FIG. 1. FIGS. 11A to 11D are diagrams for describing operations according to the flowcharts of FIG. 10A to 10C.

Embodiments corresponding to the case where the sudden power-off SPO occurs immediately after the program failure P/F occurs in a certain memory block will be described with reference to FIGS. 10A to 10C and 11A to 11D. However, this is for describing embodiments of the inventive concept easily, and the example embodiments of the inventive concepts are not limited thereto.

Referring to FIGS. 1 and 10A, in operation S410, the storage device 120 may detect the program failure P/F while a normal operation is performed. In operation S420, the storage device 120 may report to the host 110 on the error information ERI in response to the detected program failure P/F.

Figure 11A:
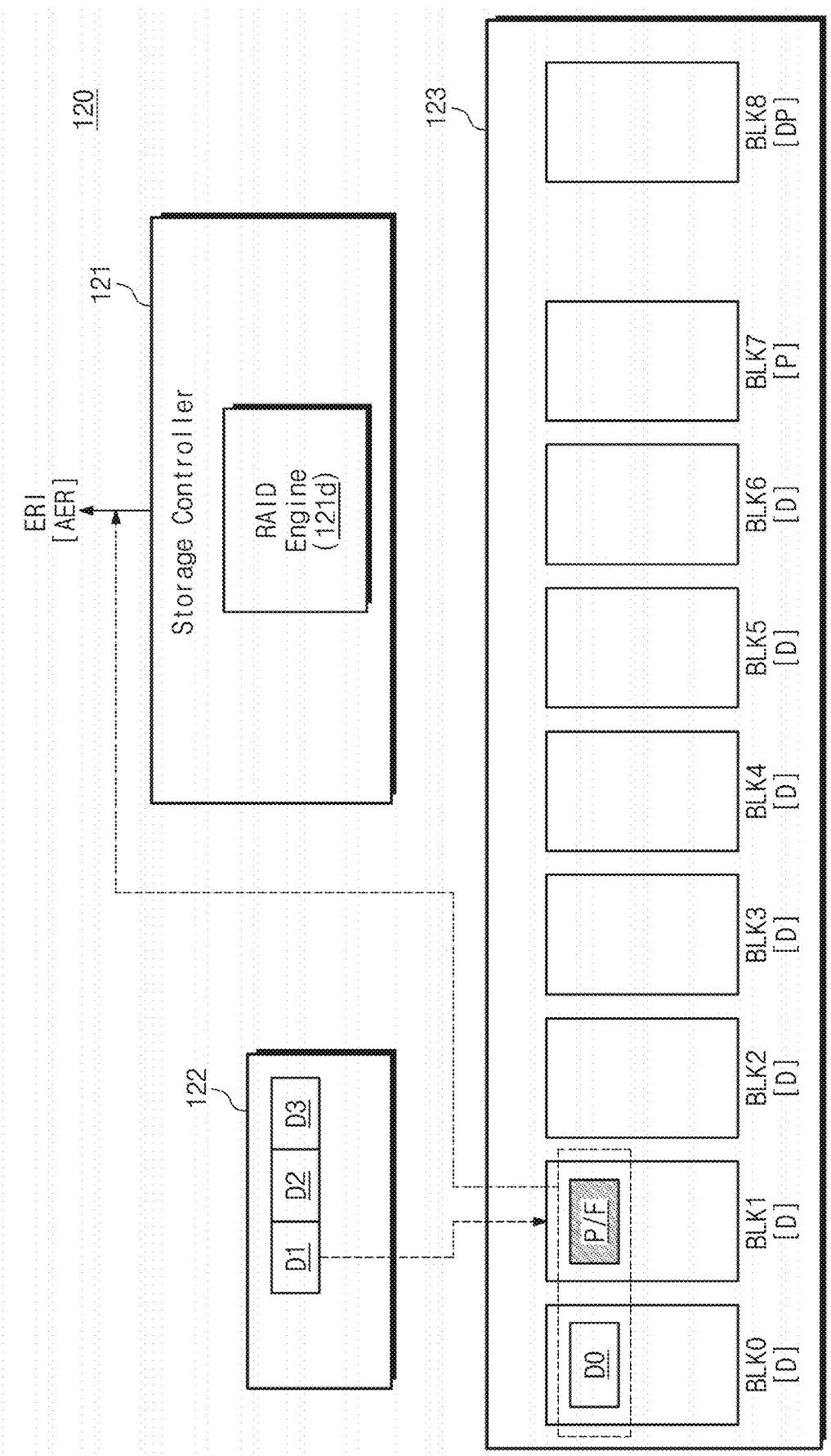
FIGS. 11A to 11D are diagrams for describing operations according to flowcharts of FIG. 10A to 10C.

For example, as illustrated in FIG. 11A, the storage device 120 may write the first user data D1 of the buffer memory 122 in the first memory block BLK1 being the data block "D". In this case, the program failure P/F may occur in the first memory block BLK1. In response to the program failure P/F associated with the first memory block BLK1, the storage controller 121 may transmit the error information ERI to the host 110. In an example embodiment, the error information ERI may be provided through the AER completion.

Afterwards, in operation S430, the storage device 120 may detect the sudden power-off SPO immediately after program failure P/F. In operation S440, the storage device 120 may perform the data dump operation in response to the detected sudden power-off SPO.

Figure 11B:
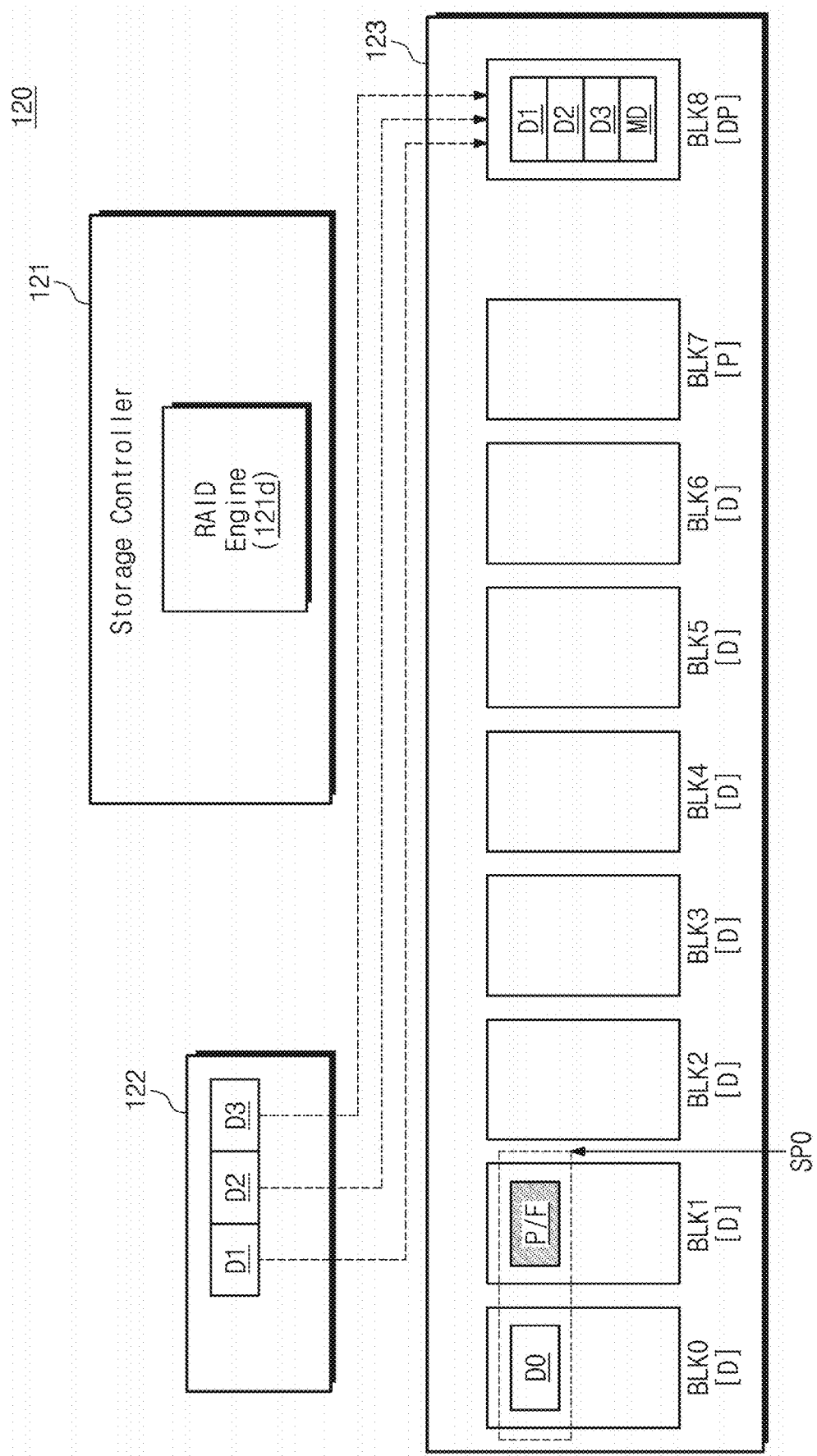

For example, as illustrated in FIG. 11B, the sudden power-off SPO may occur immediately after the program failure P/F associated with the first memory block BLK1. In this case, the buffer memory 122 may maintain the first to third user data D1 to D3. The reason is that the first user data D1 is not normally written in the first memory block BLK1 being the corresponding data block "D" due to the program failure P/F associated with the first memory block BLK1.

Figure 5D:
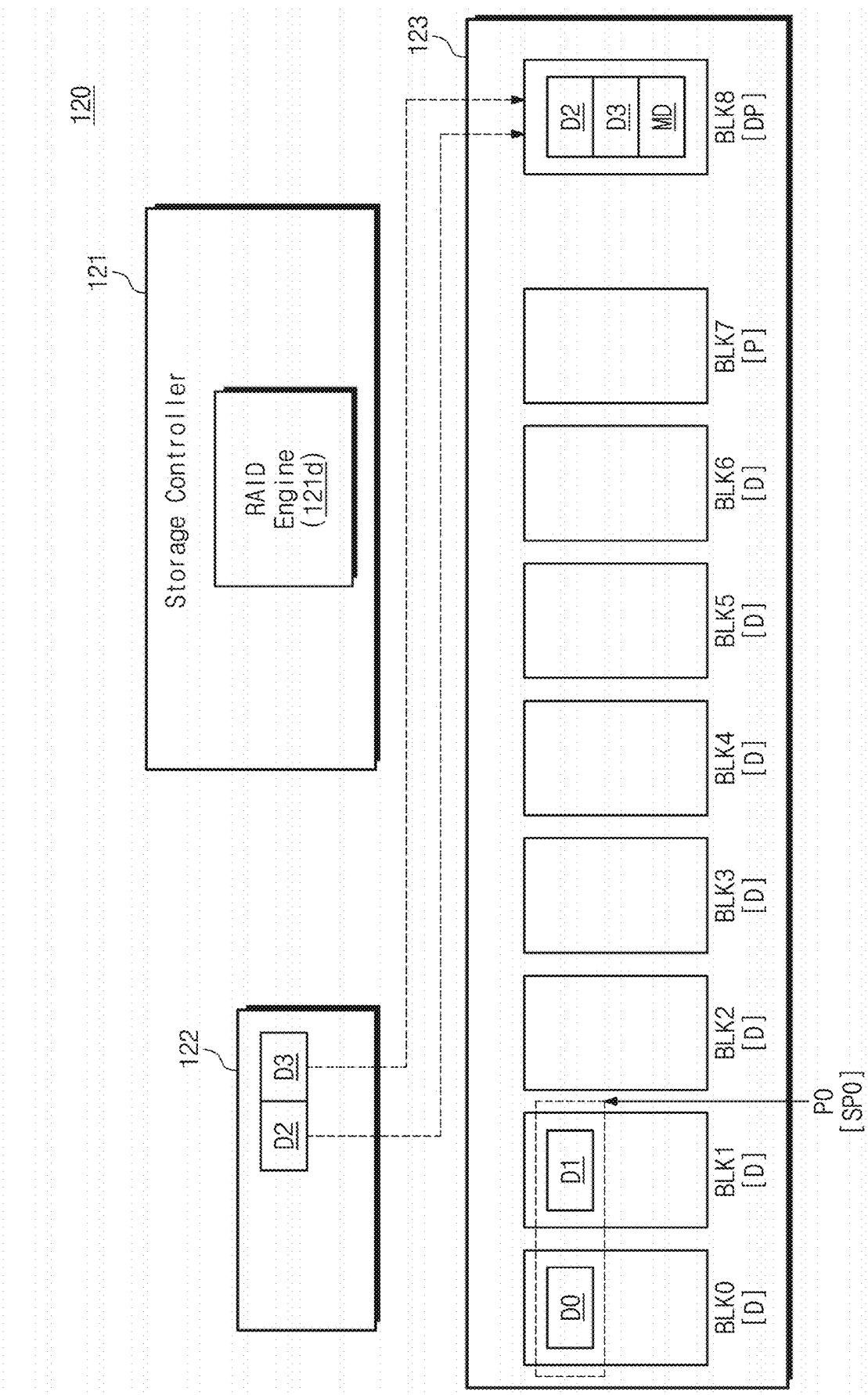

As in the description given with reference to FIG. 5D, the storage device 120 may dump user data (i.e., D1, D2, and D3) being maintained in the buffer memory 122 to the eighth memory block BLK8 being the dump block DP. In an example embodiment, the metadata MD for the first to third user data D1 to D3 may be dumped to the eighth memory block BLK8. Although not illustrated in drawings, the metadata MD for the first to third user data D1 to D3 may be dumped to a separate memory block different from the eighth memory block BLK8.

In an example embodiment, in the case where the sudden power-off SPO occurs after a sufficient time elapses from the program failure P/F, the first user data D1 may not be maintained in the buffer memory 122. In detail, before the sudden power-off SPO occurs, the host 110 may recognize that the program failure P/F occurs in the first memory blocks BLK1, in response to the error information ERI; when the host 110 fetches the first user data D1, the first user data D1 may be released from the buffer memory 122. For this reason, the first user data D1 may not be maintained in the buffer memory 122. In this case, because the host 110 normally recognizes the first user data D1, a separate dump operation for the first user data D1 may not be required.

Afterwards, in operation S450, the storage device 120 may be powered on. In operation S460, the storage device 120 may perform the data recovery operation associated with the program failure P/F.

For example, as described with reference to FIGS. 6 and 7, in the data recovery operation not associated with the program failure P/F, under the control of the storage device 120, user data stored in the eighth memory block BLK8 being the dump block DP may migrate to the corresponding data blocks.

In contrast, in the case where the sudden power-off SPO occurs immediately after the program failure P/F, a separate data recovery operation for data to be stored in the memory block being in the program failure (P/F) state may be performed.

For example, referring to FIGS. 1, 10A, and 10B, when the storage device 120 is powered on after the sudden power-off SPO that occurs immediately after the program failure P/F, the storage device 120 may perform the data recovery operation associated with the program failure P/F through operation S461A to operation S461D.

In operation S461A, the storage device 120 may allow user data to migrate from the dump block to the corresponding data block. In this case, user data (i.e., P/F data) to be stored in a data block being in a program failure (P/F) state may be excluded.

Afterwards, the storage device 120 may perform operation S461B to operation S461D. Operation S461B to operation S461D are similar to operation S350 to operation S370 of FIG. 8, and thus, additional description will not be omitted to avoid redundancy.

Figure 11C:
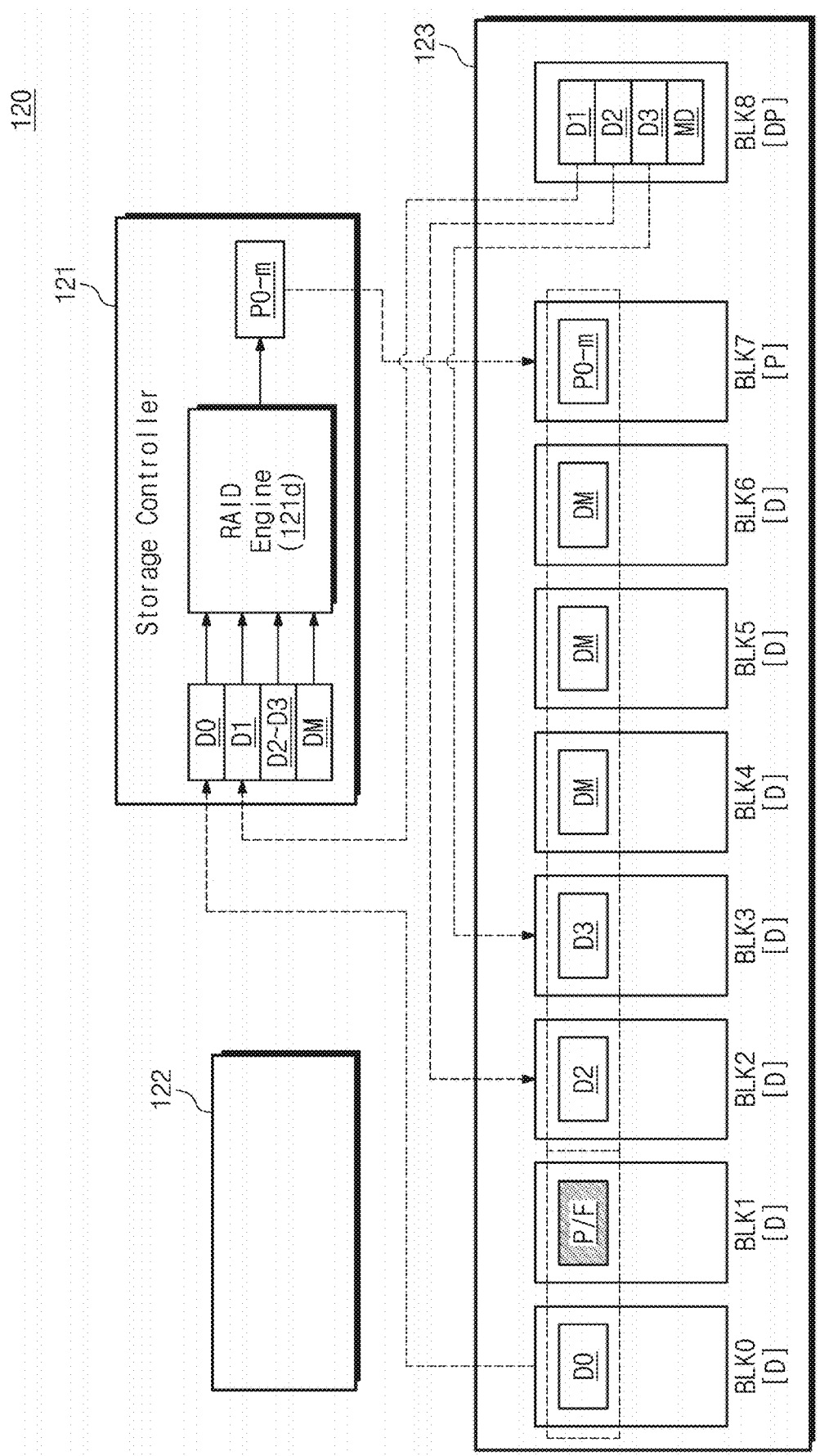

For example, as illustrated in FIG. 11C, at a time when the storage device 120 is powered on, the eighth memory block BLK8 being the dump block DP may include the first to third user data D1 to D3 and the metadata MD.

In this case, based on the metadata MD, the storage device 120 may determine locations (i.e., physical locations of memory blocks) where the first to third user data D1 to D3 will be stored, and a memory block being in the program failure (P/F) state.

In the embodiment of FIG. 11C, because the program failure P/F occurs in the first memory block BLK1, a program operation for the first memory block BLK1 may be skipped, and the first user data D1 being the P/F data are provided as an input of the RAID engine 121d.

The storage device 120 may write the second and third user data D2 and D3 stored in the eighth memory block BLK8 being the dump block DP in the second and third memory blocks BLK2 and BLK3 being the corresponding data blocks "D", respectively. Afterwards, as in the above description, the storage device 120 may write the dummy data DM in each of the remaining data blocks (e.g., BLK4 to BLK6). Afterwards, as in the above description, the RAID engine 121d of the storage controller 121 may generate the parity data P0-m based on the 0-th to third user data D0 to D3 included in the first stripe STR1, and the dummy data DM (i.e., three dummy data). The generated parity data P0-m may be written in the seventh memory block BLK7 being the parity block "P".

As described above, in the case where the sudden power-off SPO occurs immediately after the program failure P/F associated with a certain memory block, the storage device 120 according to an example embodiment may dump user data present in the buffer memory 122 to the dump block DP. Afterwards, when a power is turned on, the storage device 120 may respectively write pieces of user data of the dump block DP in the corresponding memory blocks, and may generate parity data based on P/F data (i.e., user data to be written in a memory block being in a program failure (P/F) state) of the dump block DP and data (or dummy data) written in data blocks. Accordingly, the P/F data may be normally recovered by using the corresponding parity data.

In an example embodiment, for example, referring to FIGS. 1, 10A, and 10C, when the storage device 120 is powered on after the sudden power-off SPO that occurs immediately after the program failure P/F, the storage device 120 may perform the data recovery operation associated with the program failure P/F through operation S462A to operation S462D.

In operation S462A, the storage device 120 may write user data of the dump block DP in the corresponding data blocks "D", respectively. In operation S462B, the storage device 120 may determine whether the program failure P/F occurs with regard to a certain memory block.

When it is determined that the program failure P/F occurs with regard to the certain memory block, in operation S462C, the storage device 120 may load user data (i.e., P/F data) to be written in a memory block being in a program failure (P/F) state onto the buffer memory 122 and may report to the host 110 on associated error information ERI'.

In operation S462D, the storage device 120 may release an area of the buffer memory 122, in which the P/F data are stored, in response to a confirm command from the host 110.

Figure 11D:
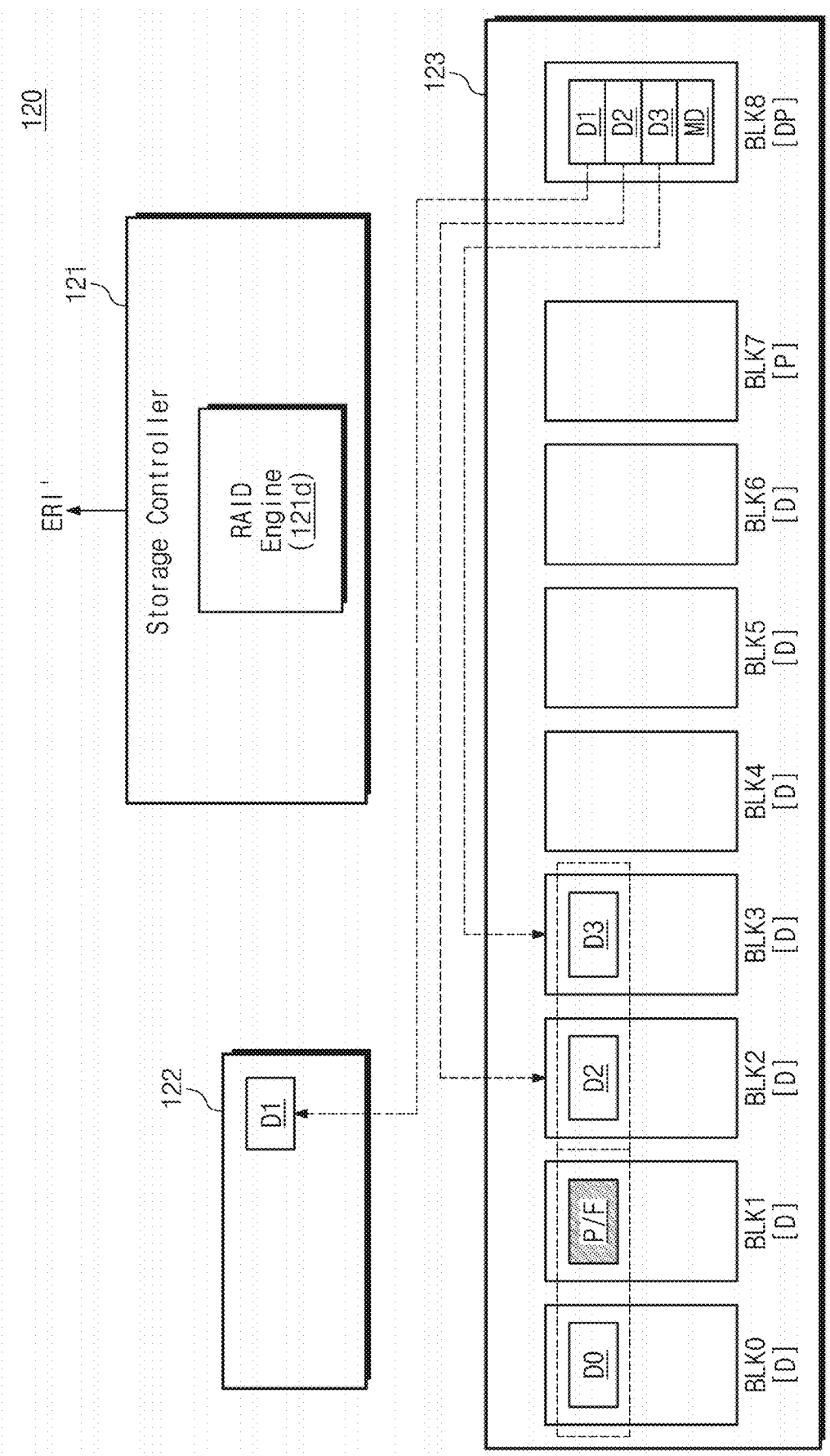

For example, as illustrated in FIG. 11D, the eighth memory block BLK8 being the dump block DP may include the first to third user data D1 to D3 and the metadata MD.

The storage device 120 may write the first to third user data D1 to D3 stored in the eighth memory block BLK8 being the dump block DP in the first to third memory blocks BLK1 to BLK3 being the corresponding data blocks "D", respectively. Here, because the first memory block BLK1 is a bad block, the program failure P/F may occur with regard with the first memory block BLK1. In this case, the first user data D1 may be the P/F data.

In response to the program failure P/F associated with the first memory block BLK1, the storage controller 121 may load the first user data D1 being the P/F data onto the buffer memory 122 and may transmit the associated error information ERI' to the host 110.

Although not illustrated in drawings, in response to the associated error information ERI', the host 110 may recognize that the program failure P/F occurs in the first memory block BLK1 and may fetch the first user data D1 loaded onto the buffer memory 122. Alternatively, the host 110 may perform a bad block replacing operation in response to the associated error information ERI'.

In an example embodiment, the storage device 120 may load the first user data D1 onto the buffer memory 122 based on the metadata MD, without a program operation for the first memory block BLK1. For example, the metadata MD may include information indicating that the program failure P/F occurs in the first memory block BLK1 immediately before the sudden power-off SPO. Based on the metadata MD, the storage device 120 may recognize that the program failure P/F occurs in the first memory block BLK1 before the sudden power-off SPO. As such, the storage device 120 may skip a program operation for the first user data D1 and may load the first user data D1 onto the buffer memory 122. Afterwards, the storage device 120 may transmit the associated error information ERI' to the host 110.

As described above, the storage device 120 according to an example embodiment may load user data (i.e., P/F data) to be stored in a memory block being in a program failure (P/F) state onto the buffer memory 122 and may transmit the associated error information ERI' to the host 110. The host 110 may fetch the P/F data loaded onto the buffer memory 122 in response to the associated error information ERI'. Accordingly, even though the sudden power-off SPO occurs immediately after the program failure P/F associated with a certain memory block, the reliability of user data present in the buffer memory 122 is secured.

Figure 12:
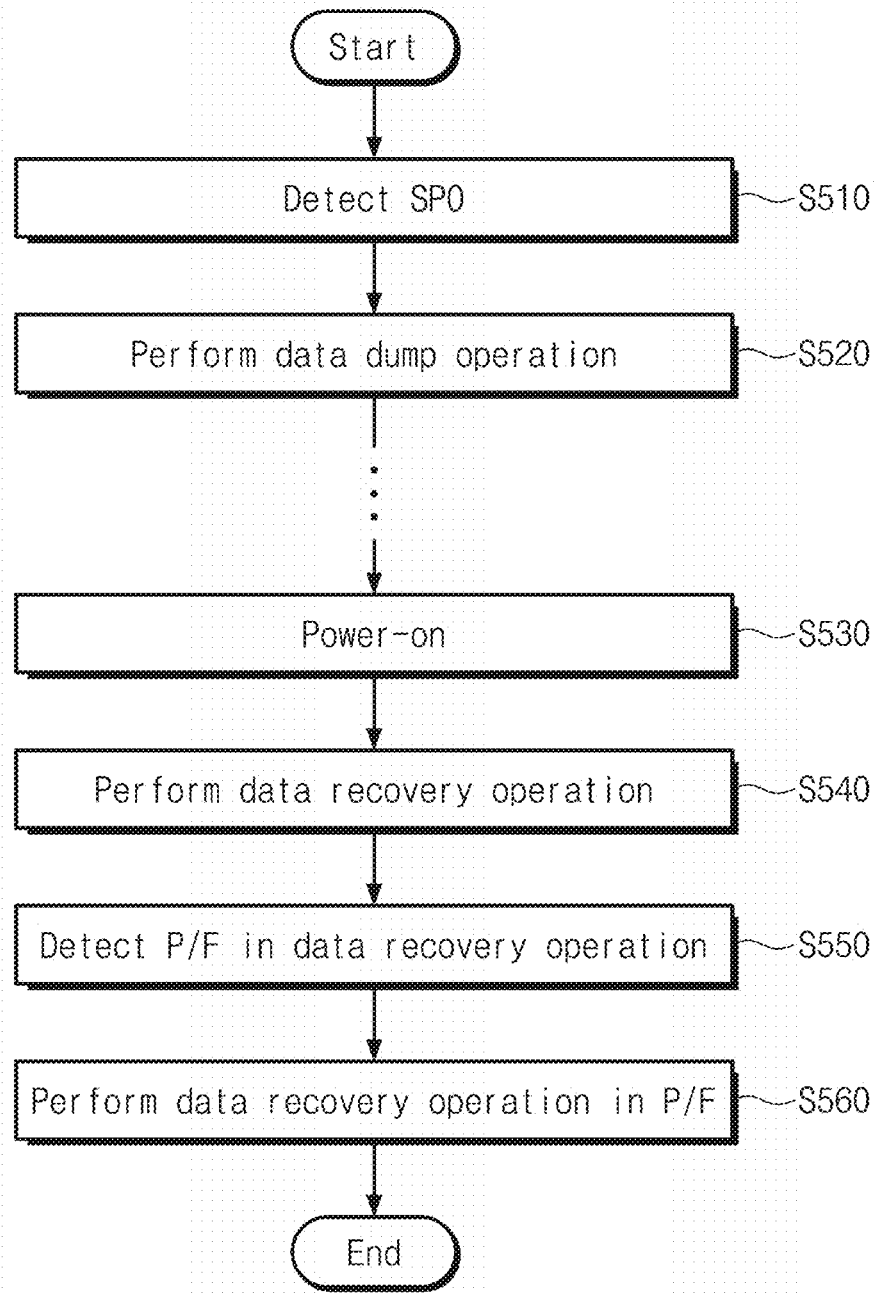
FIG. 12 is a flowchart illustrating an operation of a storage device of FIG. 1.
Figure 13A:
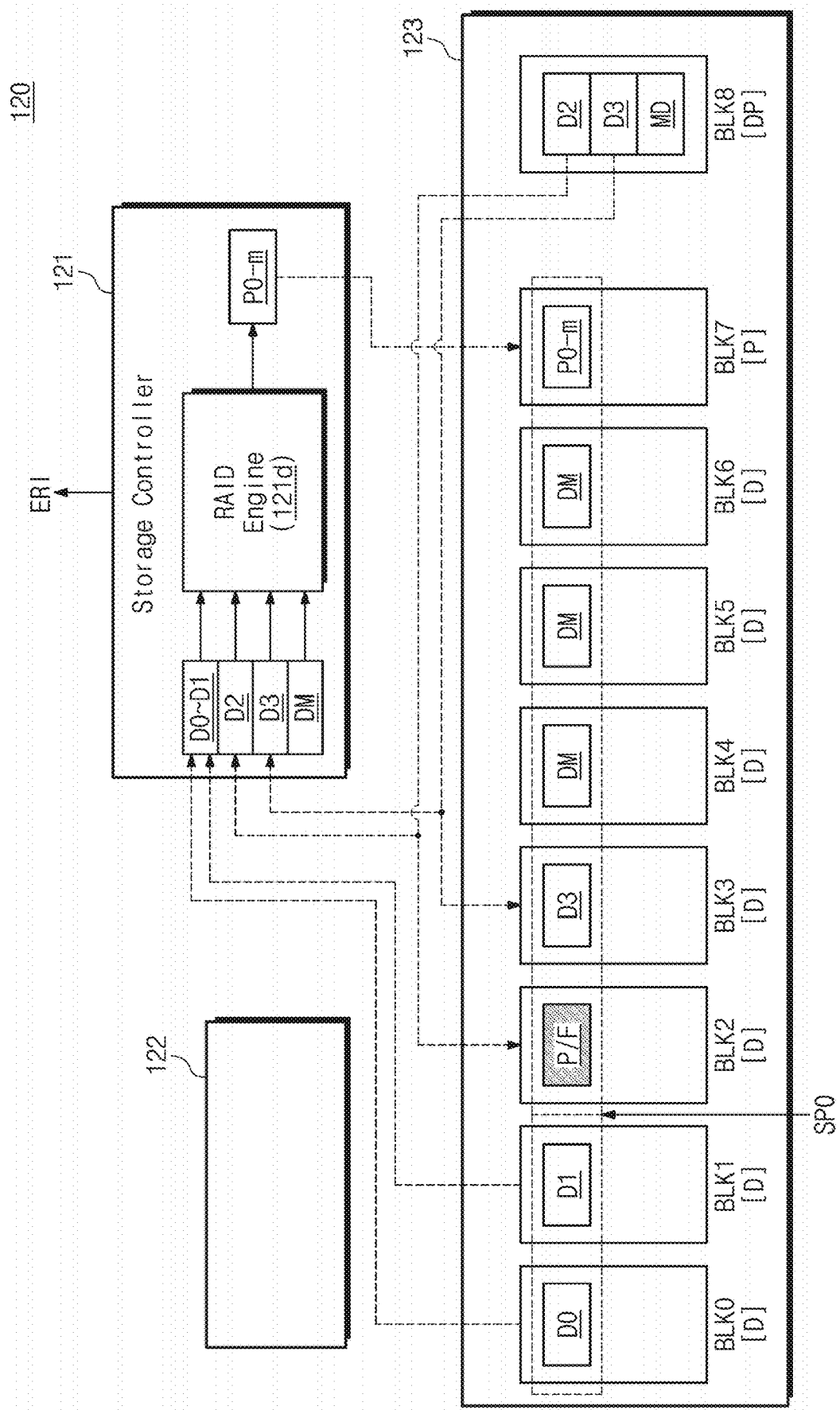
FIGS. 13A and 13B are diagrams for describing an operation according to a flowchart of FIG. 12.
Figure 13B:
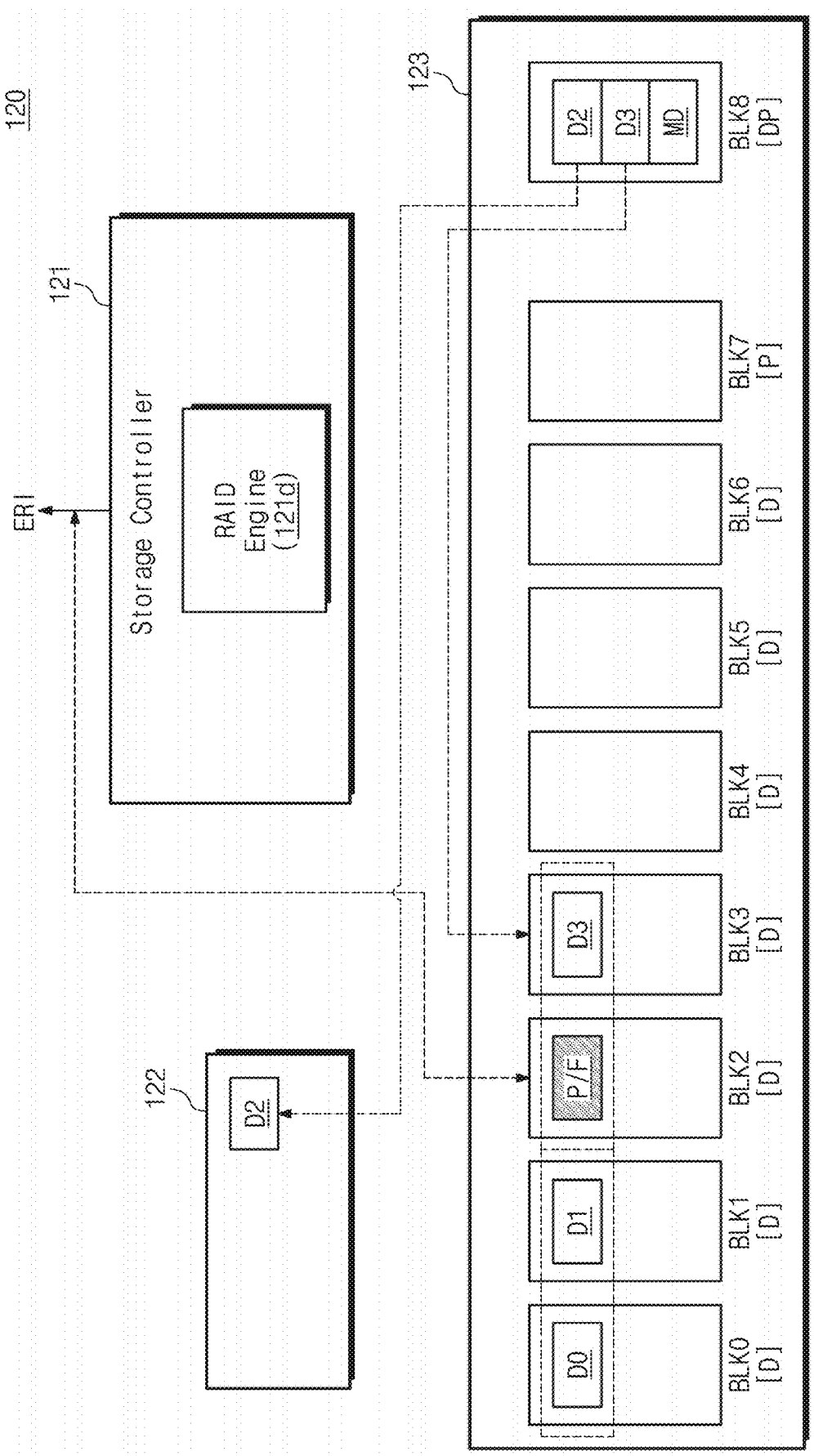

FIG. 12 is a flowchart illustrating an operation of a storage device of FIG. 1. FIGS. 13A and 13B are diagrams for describing an operation according to the flowchart of FIG. 12. Referring to FIGS. 1 and 12, the storage device 120 may perform operation S510 and operation S520. Operation S510 and operation S520 are similar to operation S120, operation S130, and operation S150 of FIG. 4, and thus, additional description will be omitted to avoid redundancy.

Afterwards, the storage device 120 may perform operation S530 and operation S540. Operation S530 and operation S540 are similar to operation S210 to operation S230 of FIG. 6, and thus, additional description will be omitted to avoid redundancy.

In operation S550, the storage device 120 may detect the program failure P/F during the data recovery operation. For example, the storage device 120 may allow pieces of user data stored in the dump block DP to migrate into the corresponding data blocks, that is, may perform the data recovery operation. In this case, the program failure P/F may occur in a certain memory block.

In operation S560, the storage device 120 may perform the data recovery operation associated with the program failure P/F in response to the detected program failure P/F. For example, the storage device 120 may operate based on the operation methods described with reference to FIGS. 10A to 10C and 11A to 11D.

That is, the storage device 120 may provide user data (i.e., P/F data) to be stored in a memory block (i.e., a bad block) being in a program failure (P/F) state as an input of the RAID engine 121d without writing the user data (i.e., P/F data) in the bad block and may generate parity data for the corresponding stripe. Alternatively, the storage device 120 may load the P/F data to be stored in the bad block onto the buffer memory 122 and may provide the associated error information ERI' to the host 110.

In detail, in the embodiment illustrated in FIGS. 13A and 13B, it is assumed that the sudden power-off SPO occurs after the 0-th and first user data D0 and D1 are respectively stored in the 0-th and first memory blocks BLK0 and BLK1 being the corresponding data blocks "D", and thus, the second and third user data D2 and D3 and the metadata MD are dumped to the eighth memory block BLK8 being the dump block DP. Also, it is assumed that the program failure P/F occurs in the second memory block BLK2 when a power is turned on after the sudden power-off SPO. However, the above conditions and assumptions may be only an example for describing an example embodiment clearly, and the example embodiments of the inventive concepts are not limited thereto.

Referring to FIGS. 1, 12, and 13A, when a power is turned on after the sudden power-off SPO, the storage device 120 may write the second and third user data D2 and D3 stored in the eighth memory block BLK8 being the dump block DP in the second and third memory blocks BLK2 and BLK3 being the corresponding data blocks "D", respectively. During this write operation, the program failure P/F may occur in the second memory block BLK2. In this case, in response to the program failure P/F associated with the second memory block BLK2, the storage device 120 may provide the second user data D2 to be stored in the second memory block BLK2 as an input of the RAID engine 121d and may transmit the associated error information ERI to the host 110.

In an example embodiment, an operation of writing the dummy data DM in each of the remaining data blocks (e.g., BLK4 to BLK6), an operation in which the RAID engine 121d generates the parity data P0-m based on user data included in one stripe and dummy data, and an operation in which the parity data P0-m are stored in the seventh memory block BLK7 being the parity block "P" are similar to the above descriptions, and thus, additional description will be omitted to avoid redundancy.

Alternatively, referring to FIGS. 1, 12, and 13B, the storage device 120 may write the second and third user data D2 and D3 stored in the eighth memory block BLK8 being the dump block DP in the second and third memory blocks BLK2 and BLK3 being the corresponding data blocks "D", respectively. During this write operation, the program failure P/F may occur in the second memory block BLK2. In this case, in response to the program failure P/F associated with the second memory block BLK2, the storage device 120 may load the second user data D2 to be written in the second memory block BLK2 onto the buffer memory 122 and may transmit the associated error information ERI to the host 110. A next operation in which the host 110 fetches the second user data D2 loaded onto the buffer memory 122 in response to the error information ERI is similar to the above description, and thus, additional description will be omitted to avoid redundancy.

That is, as described above, when a power is turned on after the sudden power-off SPO, the storage device 120 may perform the data recovery operation on user data stored in the dump block DP. In the case where the program failure P/F occurs in a certain memory block during the data recovery operation, the storage device 120 may generate parity data based on remaining user data including P/F data; alternatively, the storage device 120 may load P/F data onto the buffer memory 122 and may provide the error information ERI to the host 110. This may mean that the reliability of the P/F data may be secured.

Figure 14:
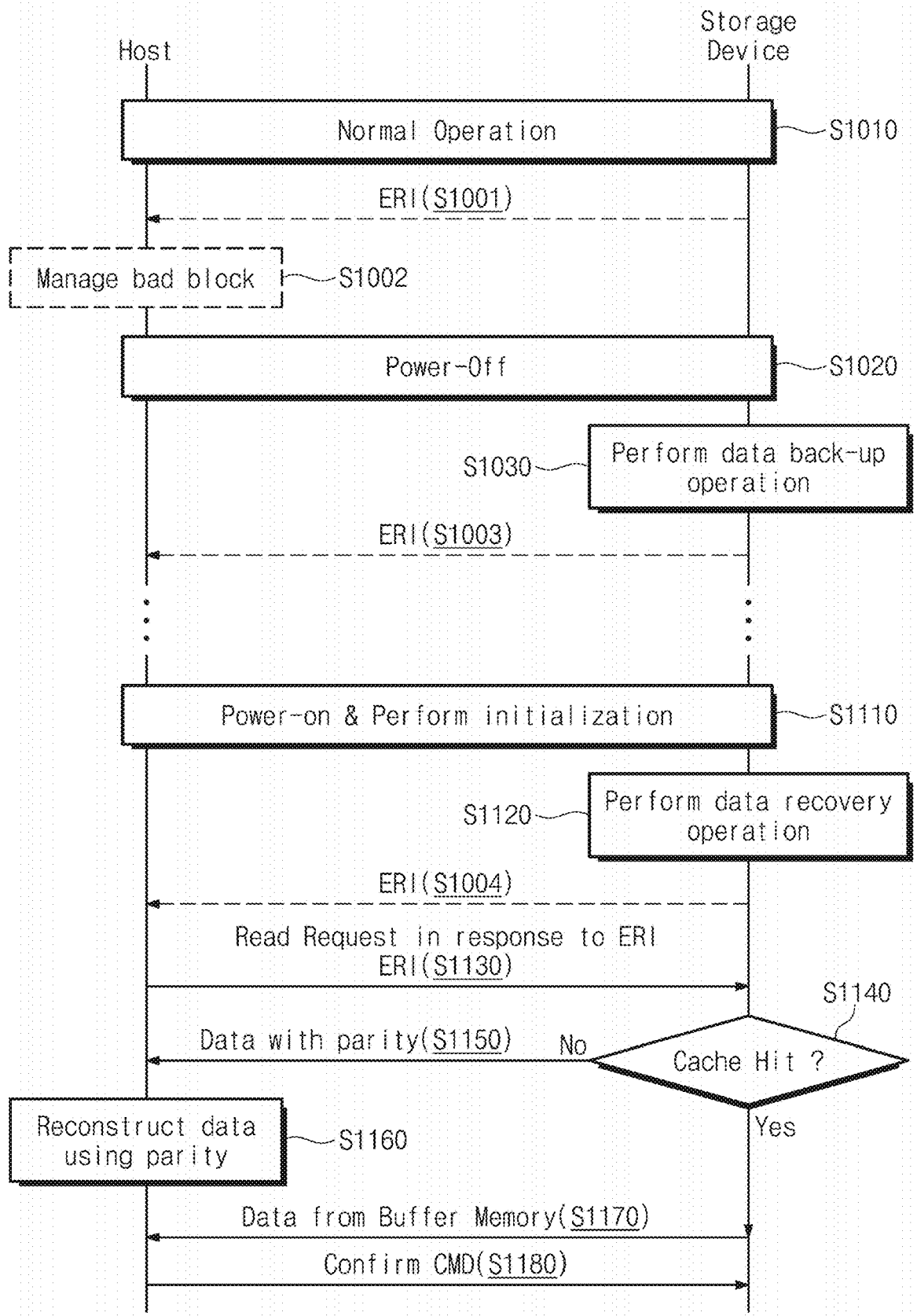
FIG. 14 is a flowchart illustrating an operation between a host and a storage device of FIG. 1.

FIG. 14 is a flowchart illustrating an operation between a host and a storage device of FIG. 1. For convenience of description, with regard to the above-described embodiments, additional description will be omitted to avoid redundancy. However, the example embodiments of the inventive concepts are not limited thereto. For example, respective operations of the flowchart illustrated in FIG. 14 may be implemented with at least one of the above embodiments or a combination of at least two of the above embodiments.

Referring to FIGS. 1 and 14, in operation S1010, the host 110 and the storage device 120 may perform a normal operation. For example, the host 110 and the storage device 120 may perform the normal operation as described with reference to FIG. 5A.

In operation S1001, the storage device 120 may transmit the error information ERI to the host 110. For example, the storage device 120 may perform the normal operation under the control of the host 110. While the normal operation is performed, the program failure P/F may be detected with regard to a certain memory block. In this case, as described with reference to FIG. 1, because the storage device 120 does not include a bad block management function, the storage device 120 may provide the error information ERI associated with the program failure P/F to the host 110.

In an example embodiment, the error information ERI may be provided as the AER completion (Asynchronous Event Request Completion). For example, the host 110 may transmit the AER to the storage device 120 during an initialization operation that is performed together with the storage device 120. The AER may be used for the storage device 120 to provide certain information to the host 110 regardless of the control of the host 110. When a certain event (e.g., the program failure P/F) occurs in the storage device 120, associated information (i.e., the error information ERI) may be provided to the host 110 as a completion response of the above AER.

In operation S1002, the host 110 may perform a bad block management operation based on the error information ERI. For example, as described with reference to FIG. 1, the host flash translation layer 111 of the host 110 may manage a bad block included in the nonvolatile memory device 123 of the storage device 120. That is, in response to the error information ERI, the host 110 may replace a bad block with a normal block and may update an associated map table.

In operation S1020, the storage device 120 may be powered off. For example, as described above, the storage device 120 may detect the normal power-off NPO or the sudden power-off SPO by detecting information about the normal power-off NPO from the host 110 or a drop of a power supply voltage.

In operation S1030, the storage device 120 may perform a data backup operation. In an example embodiment, operation S1030 may include the data flush operation after the normal power-off NPO or the data dump operation after the sudden power-off SPO, which is described with reference to FIGS. 1 to 13B. That is, the storage device 120 may operate in compliance with one of the embodiments described with reference to FIGS. 1 to 13B, based on a kind of a detected power-off, whether the program failure P/F occurs, or a time or when the program failure P/F occurs.

In an example embodiment, when the detected power-off is the normal power-off NPO and the program failure P/F occurs in operation S1030, in operation S1003, the storage device 120 may transmit the error information ERI to the host 110. Although not illustrated in drawings, the host 110 may perform a bad block management operation based on the error information ERI.

Afterwards, in operation S1110, the host 110 and the storage device 120 may be powered on and may perform an initialization operation. In an example embodiment, during the initialization operation, the above-described AER may be provided from the host 110 to the storage device 120.

In operation S1120, the storage device 120 may perform the data recovery operation. For example, the storage device 120 may operate in compliance with one of the embodiments described with reference to FIGS. 1 to 13B, based on a kind of a previous power-off (i.e., NPO or SPO), whether the program failure P/F occurs, or a time when the program failure P/F occurs.

In an example embodiment, when the program failure P/F occurs in operation S1030, the storage device 120 may transmit the error information ERI to the host 110. Although not illustrated in drawings, the host 110 may perform the bad block management operation based on the error information ERI.

In an example embodiment, because operation S1001, operation S1003, and operation S1004 where the error information ERI is transmitted are selectively performed according to a way to operate or according to an embodiment or because times when operation S1001, operation S1003, and operation S1004 are performed are not designated, operation S1001, operation S1003, and operation S1004 are illustrated by a dotted line. Operation S1001, operation S1003, and operation S1004 where the error information ERI is transmitted may be selectively performed according to the above-described embodiments, and times when the error information ERI is transmitted are respectively described with reference to the above embodiments. Thus, additional description will be omitted to avoid redundancy.

In operation S1130, the host 110 may transmit a read request to the storage device 120 in response to the error information ERI. In an example embodiment, the read request may be a read request for reading user data (i.e., P/F data) to be stored in a memory block (i.e., a bad block) being in a program failure (P/F) state. Alternatively, the read request may be a read request for reading data (not including P/F data) and parity data of a stripe in which the P/F data are included.

In operation S1140, the storage device 120 may determine whether data corresponding to the received read request are present in the buffer memory 122 (i.e., whether a cache hit is occurred). For example, when the storage device 120 operates according to the embodiment where the P/F data are loaded onto the buffer memory 122, the data (i.e., the P/F data) corresponding to the read request may be present in the buffer memory 122.

In this case (i.e., in the case where the cache hit is occurred), the storage device 120 may transmit the corresponding user data (i.e., the P/F data) stored in the buffer memory 122 to the host 110.

In contrast, when the storage device 120 operates according to the embodiment where the P/F data are provided as an input of the RAID engine 121d, the data (i.e., the P/F data) corresponding to the read request may be absent from the buffer memory 122.

In this case (i.e., in the case where a cache miss is generated), the storage device 120 may provide the host 110 with parity data and remaining data, which correspond to a stripe where the P/F data are included.

In operation S1160, the host 110 may recover the P/F data based on the data and the parity data received in operation S1150.

Afterwards, in operation S1180, the host 110 may transmit a confirm command to the storage device 120. In an example embodiment, the storage device 120 may release the buffer memory 122 where the P/F data are stored, in response to the confirm command.

In an example embodiment, the confirm command may include a Get Log Page command, a vendor command, or a combination of various commands.

Figure 15:
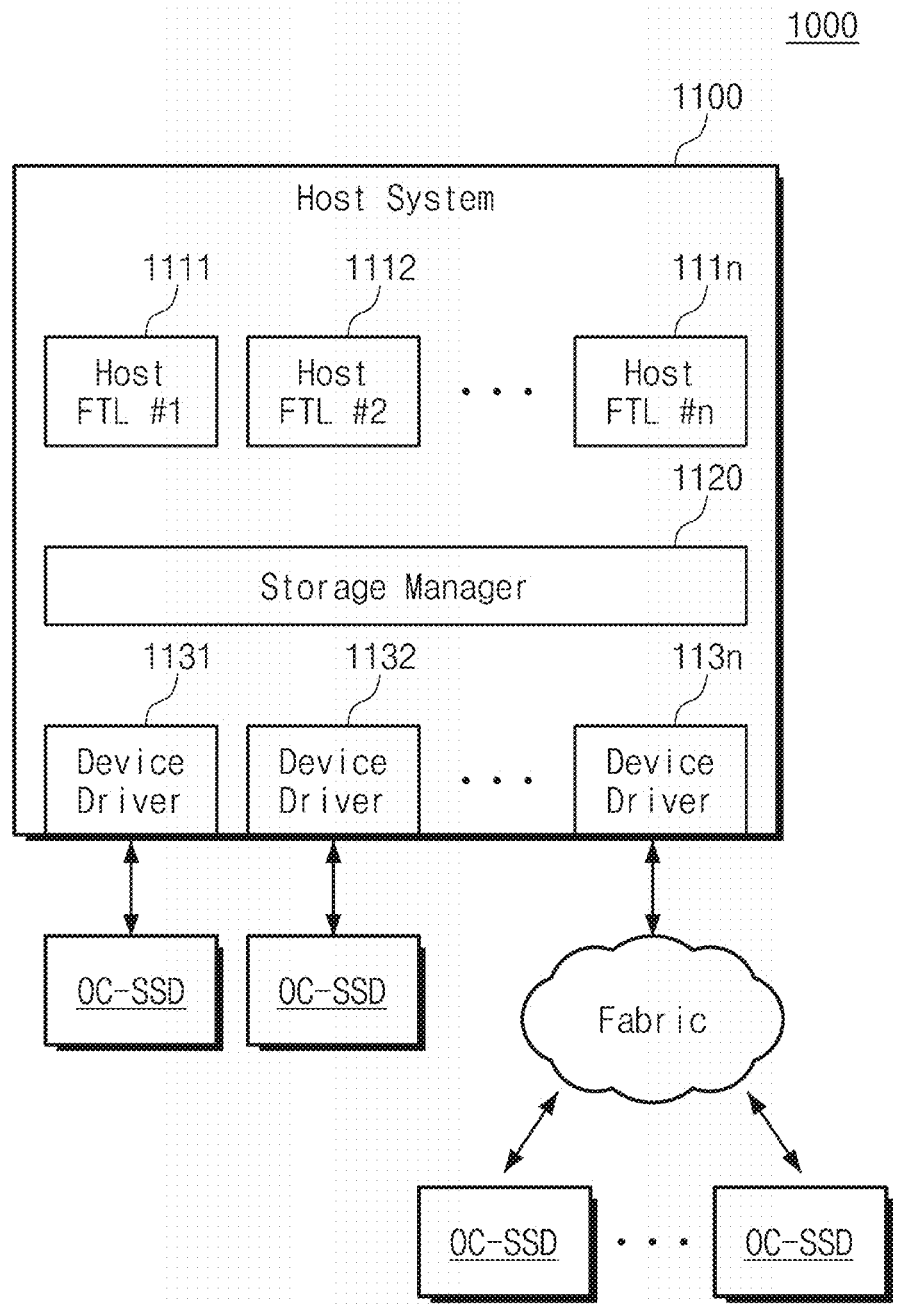
FIG. 15 is a block diagram illustrating a server system to which a storage device according to an example embodiment is applied.

FIG. 15 is a block diagram illustrating a server system to which a storage device according to an example embodiment is applied. Referring to FIG. 15, a server system 1000 may include a host system 1100 and a plurality of open-channel SSDs OC-SSD. In an example embodiment, the server system 1000 may include a server, a workstation, or a data center.

The host system 1100 may include a plurality of host FTLs 1111 to 111n, a storage manager 1120, and a plurality of device drivers 1131 to 113m. The plurality of host FTLs 1111 to 111n may be configured to manage physical storage spaces of the plurality of open-channel SSDs OC-SSD, respectively. For example, each of the plurality of host FTLs 1111 to 111n may include a map table, a bad block manager, an I/O scheduler, a wear-leveling manager, a garbage collection manager, etc. The storage manager 1120 may be configured to manage a network of the plurality of open-channel SSDs OC-SSD. Each of the plurality of device drivers 1131 to 113m may be configured to perform data translation for communication with the corresponding open-channel SSD OC-SSD.

Each of the plurality of open-channel SSDs OC-SSD may be directly connected with the host system 1100 or may be connected with the host system 1100 through a network fabric. Each of the plurality of open-channel SSDs OC-SSD may operate under control of the host system 1100. For example, each of the plurality of open-channel SSDs OC-SSD may receive a physical address indicating a direct location associated with a storage space from the host system 1100 and may perform an operation for a storage space corresponding to the received physical address.

In an example embodiment, each of the plurality of open-channel SSDs OC-SSD may operate according to one of the embodiments described with reference to FIGS. 1 to 14 or may operate according to a combination thereof. That is, when the program failure P/F occurs under a certain condition (e.g., a power-off), each of the plurality of open-channel SSDs OC-SSD may operate according to one of the embodiments described with reference to FIGS. 1 to 14 or according to a combination thereof, thus securing the reliability of user data.

According to example embodiments of the inventive concepts, the reliability of user data may be improved in a storage device that is controlled by a host driving a host flash translation layer. Accordingly, an operation method of an open-channel storage device having the improved reliability is provided.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

While the inventive concept has been described with reference to example embodiments thereof, it will be apparent to those of ordinary skill in the art that various changes and modifications may be made thereto without departing from the spirit and scope of the inventive concept as set forth in the following claims.

What is claimed is:

1. An operation method of an open-channel storage device, the open-channel storage device being configured to be controlled by a host, the open-channel storage device including a buffer memory and a nonvolatile memory device, the method comprising:
   performing a normal operation under a control of the host;
   detecting a sudden power-off immediately after a program failure associated with a first data block among a plurality of memory blocks included in the nonvolatile memory device while the normal operation is performed;
   dumping a plurality of user data stored in the buffer memory to a dump block among the plurality of memory blocks in response to the detected sudden power-off;
   detecting a power-on; and
   performing a data recovery operation on the plurality of user data stored in the dump block in response to the detected power-on.

2. The method of claim 1, wherein
   each memory cell included in the dump block is configured to store "n" bits (n being a positive integer), and
   each memory cell included in the first data block is configured to store "m" bits (m being a positive integer greater than n).

3. The method of claim 1, wherein the performing the data recovery operation includes:
   loading first user data to be stored in the first data block onto the buffer memory, the first user data being from among the plurality of user data dumped to the dump block; and
   transmitting error information to the host.

4. The method of claim 3, wherein the error information is transmitted to the host through an asynchronous event request (AER) completion.

5. The method of claim 3, further comprising:
   receiving a read request for the first user data from the host, after transmitting the error information to the host;
   transmitting the first user data loaded onto the buffer memory to the host, in response to the read request;
   receiving a completion command from the host; and
   releasing the buffer memory, onto which the first user data are loaded, in response to the completion command.

6. The method of claim 1, wherein the performing the data recovery operation includes:
   storing remaining user data other than first user data to be stored in the first data block, from among the plurality of user data dumped to the dump block, in corresponding data blocks among the plurality of memory blocks, respectively;
   generating parity data based on the first user data, at least one dummy data, and at least one second user data corresponding to the first user data from among the remaining user data; and
   storing the parity data in a corresponding parity block among the plurality of memory blocks.

7. The method of claim 6, wherein the first user data and the at least one second user data are included in a same stripe.

8. The method of claim 6, further comprising:
   receiving a read request for the first user data from the host;
   recovering the first user data based on the at least one second user data, the at least one dummy data, and the parity data, in response to the read request; and
   transmitting the recovered first user data to the host.

9. The method of claim 6, further comprising:
   transmitting error information about the first user data to the host;
   receiving a read request for the at least one second user data and the parity data from the host; and
   transmitting the at least one second user data and the parity data to the host in response to the read request.

10. The method of claim 9, wherein the first user data are recovered based on the at least one second user data and the parity data.

11. The method of claim 1, wherein the performing the normal operation includes:
   receiving the plurality of user data from the host;
   storing the plurality of user data thus received in the buffer memory;
   storing the plurality of user data stored in the buffer memory to corresponding data blocks among the plurality of memory blocks, respectively;
   generating at least one parity data based on the plurality of user data; and
   storing the at least one parity data in a corresponding parity block among the plurality of memory blocks.

12. The method of claim 1, wherein the normal operation is performed based on a physical address received from the host.

13. The method of claim 1, further comprising:
transmitting error information associated with the program failure to the host,
wherein the first data block is replaced with a normal block different from a first memory block from among the plurality of memory blocks by a bad block manager of the host.

14. An operation method of an open-channel storage device, the open-channel storage device being configured to be controlled by a host, the open-channel storage device including a buffer memory and a nonvolatile memory device, the method comprising:
performing a normal operation under control of the host;
detecting a sudden power-off while the normal operation is performed;
dumping a plurality of user data stored in the buffer memory to a dump block among a plurality of memory blocks included in the nonvolatile memory device in response to the detected sudden power-off;
detecting a power-on;
performing a first data recovery operation on the plurality of user data from the dump block in response to the detected power-on;
detecting a program failure associated with a first data block among the plurality of memory blocks during the first data recovery operation; and
performing a second data recovery operation different from the first data recovery operation in response to the detected program failure.

15. The method of claim 14, wherein the first data recovery operation includes:
storing the plurality of user data stored in the dump block in corresponding data blocks among the plurality of memory blocks, respectively.

16. The method of claim 15, wherein the second data recovery operation includes:
generating parity data based on first user data to be stored in the first data block, at least one second user data corresponding to the first user data, and at least one dummy data; and
storing the generated parity data in a corresponding parity block among the plurality of memory blocks.

17. The method of claim 15, wherein the second data recovery operation includes:
loading first user data to be stored in the first data block of the plurality of memory blocks onto the buffer memory; and
transmitting error information associated with the first user data to the host.

18. The method of claim 17, further comprising:
receiving a read request for the first user data from the host, after transmitting the error information;
transmitting the first user data loaded onto the buffer memory to the host, in response to the read request; and
releasing the buffer memory, in which the first user data are stored, in response to a completion command from the host.

19. An operation method of an open-channel storage device configured to be controlled by a host including a bad block manager, and the open-channel storage device including a buffer memory and a nonvolatile memory device, the method comprising:
performing a normal operation under control of the host;
detecting a normal power-off during the normal operation;
performing a data flush operation of respectively storing a plurality of user data stored in the buffer memory in corresponding data blocks among a plurality of memory blocks included in the nonvolatile memory device, in response to the detected normal power-off;
detecting a program failure associated with a first data block among the plurality of memory blocks included in the nonvolatile memory device during the data flush operation;
transmitting error information to the host in response to the detected program failure;
generating parity data based on first user data to be stored in a first memory block of the plurality of memory blocks, second user data corresponding to the first user data, and at least one dummy data; and
storing the parity data in a corresponding parity block among the plurality of memory blocks.

20. The method of claim 19, wherein the error information is transmitted to the host through an asynchronous event request (AER) completion.

* * * * *